(12) United States Patent  (10) Patent No.: US 7,598,837 B2
Gilmartin et al.  (45) Date of Patent: Oct. 6, 2009

(54) FORM-LESS ELECTRONIC DEVICE AND METHODS OF MANUFACTURING

(75) Inventors: Michael T. Gilmartin, Tuam (IE); Frederick J. Kiko, Carlsbad, CA (US); Alan H. Benjamin, Elfin Forest, CA (US)

(73) Assignee: Pulse Engineering, Inc., San Diego, CA (US)

( * ) Notice: Subject to any disclaimer, the term of this patent is extended or adjusted under 35 U.S.C. 154(b) by 451 days.

(21) Appl. No.: 10/885,868

(22) Filed: Jul. 6, 2004

(65) Prior Publication Data

US 2005/0046534 A1  Mar. 3, 2005

Related U.S. Application Data

(60) Provisional application No. 60/485,801, filed on Jul. 8, 2003.

(51) Int. Cl.
*H01F 27/29* (2006.01)
(52) U.S. Cl. ..................................... 336/192
(58) Field of Classification Search .............. 336/65, 336/83, 192, 198, 200, 220–222, 232
See application file for complete search history.

(56) References Cited

U.S. PATENT DOCUMENTS

| | | | |
|---|---|---|---|
| 3,007,125 A | 10/1961 | Furbee | |
| 3,348,183 A | 10/1967 | Hodges et al. | |
| 3,848,208 A | 11/1974 | Dawson et al. | |
| 3,870,982 A | 3/1975 | Shibano et al. | |
| 4,498,067 A | 2/1985 | Kumokawa et al. | |
| 4,507,637 A | 3/1985 | Hayashi | |
| 4,804,340 A | 2/1989 | Hamer et al. | |
| 4,999,742 A | 3/1991 | Stampfli | |
| 5,212,345 A * | 5/1993 | Gutierrez | 174/556 |
| 5,226,221 A | 7/1993 | Kilgore | |
| 5,309,130 A | 5/1994 | Lint | |
| 5,331,536 A * | 7/1994 | Lane | 363/126 |
| 5,345,670 A | 9/1994 | Pitzele et al. | |
| 5,350,980 A | 9/1994 | Dye et al. | |
| 5,434,493 A | 7/1995 | Woody et al. | |
| 5,489,884 A | 2/1996 | Heringer et al. | |
| 5,760,669 A * | 6/1998 | Dangler et al. | 336/65 |
| 5,952,907 A | 9/1999 | McWilliams | |
| 6,204,744 B1 | 3/2001 | Shafer et al. | |
| 6,225,560 B1 | 5/2001 | Machado | |

(Continued)

FOREIGN PATENT DOCUMENTS

JP        08017659 A  *  1/1996

(Continued)

*Primary Examiner*—Tuyen Nguyen
(74) *Attorney, Agent, or Firm*—Gazdzinski & Associates, PC

(57) ABSTRACT

Improved form-less electronic apparatus and methods for manufacturing the same. In one exemplary embodiment, the apparatus comprises a shape-core inductive device having a bonded-wire coil which is formed and maintained within the device without resort to a bobbin or other form(er). The absence of the bobbin simplifies the manufacture of the device, reduces its cost, and allows it to be made more compact (or alternatively additional functionality to be disposed therein). One variant utilizes a termination header for mating to a PCB or other assembly, while another totally avoids the use of the header by directly mating to the PCB. Multi-core variants and methods of manufacturing are also disclosed.

45 Claims, 20 Drawing Sheets

U.S. PATENT DOCUMENTS

| | | |
|---|---|---|
| 6,395,983 B1 | 5/2002 | Gutierrez |
| 6,460,244 B1 | 10/2002 | Shafer et al. |
| 6,483,412 B1 | 11/2002 | Holdahl et al. |
| 6,486,763 B1 | 11/2002 | Kummel |
| 6,501,362 B1 * | 12/2002 | Hoffman et al. ............ 336/198 |
| 6,512,175 B2 | 1/2003 | Gutierrez |
| 6,583,697 B2 | 6/2003 | Koyama et al. |
| 6,587,023 B2 | 7/2003 | Miyazaki et al. |
| 6,587,026 B2 | 7/2003 | Yeh et al. |
| 6,593,840 B2 | 7/2003 | Morrison et al. |
| 6,642,827 B1 | 11/2003 | McWilliams |
| 6,809,622 B2 * | 10/2004 | Hirohashi et al. ........... 336/192 |
| 6,919,788 B2 * | 7/2005 | Holdahl et al. ................ 336/83 |
| 2002/0084881 A1 * | 7/2002 | Kummel ..................... 336/200 |

FOREIGN PATENT DOCUMENTS

| | | |
|---|---|---|
| JP | 08017660 A * | 1/1996 |
| JP | 2002-158116 | 5/2002 |
| JP | 2002-222707 | 9/2002 |

\* cited by examiner

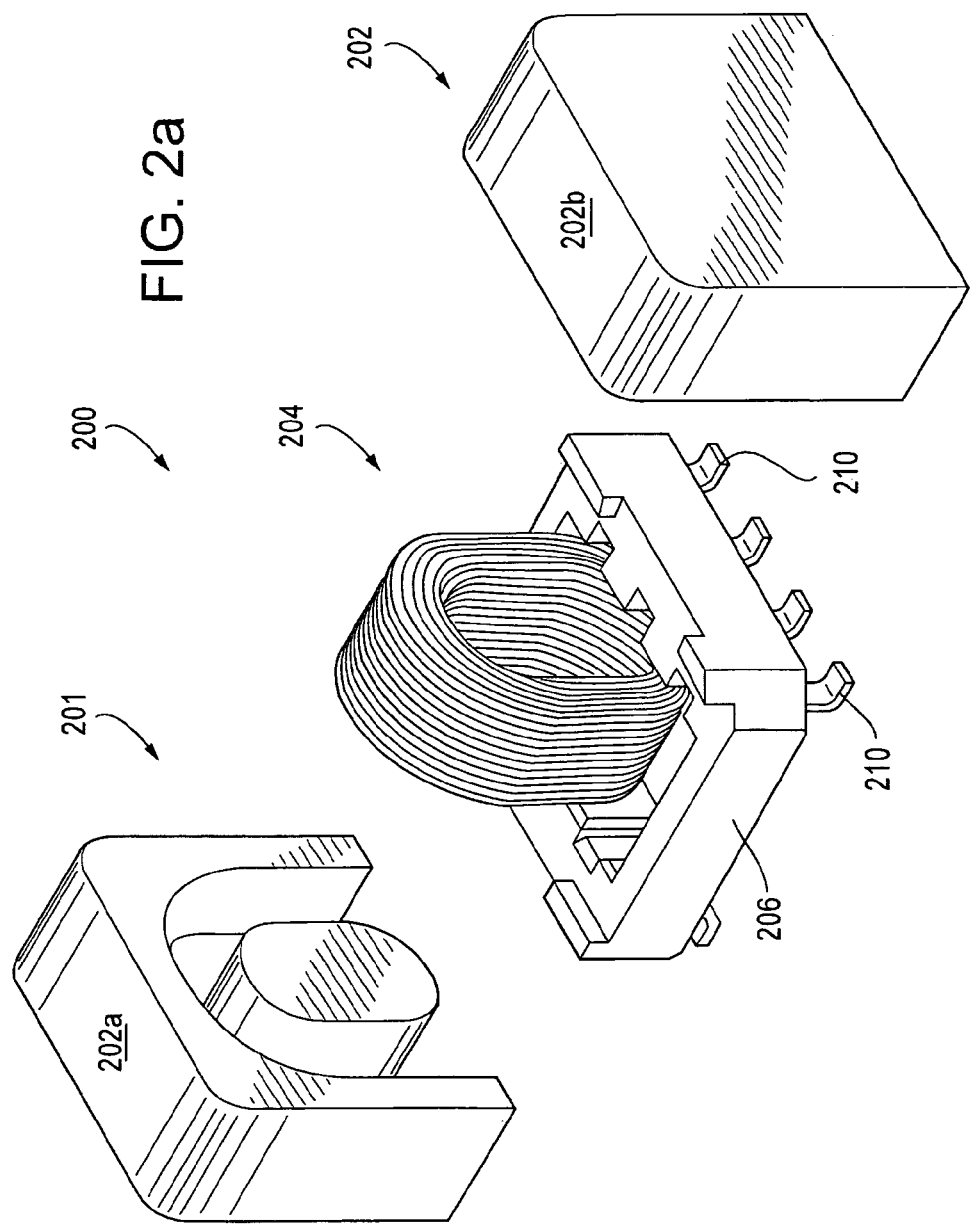

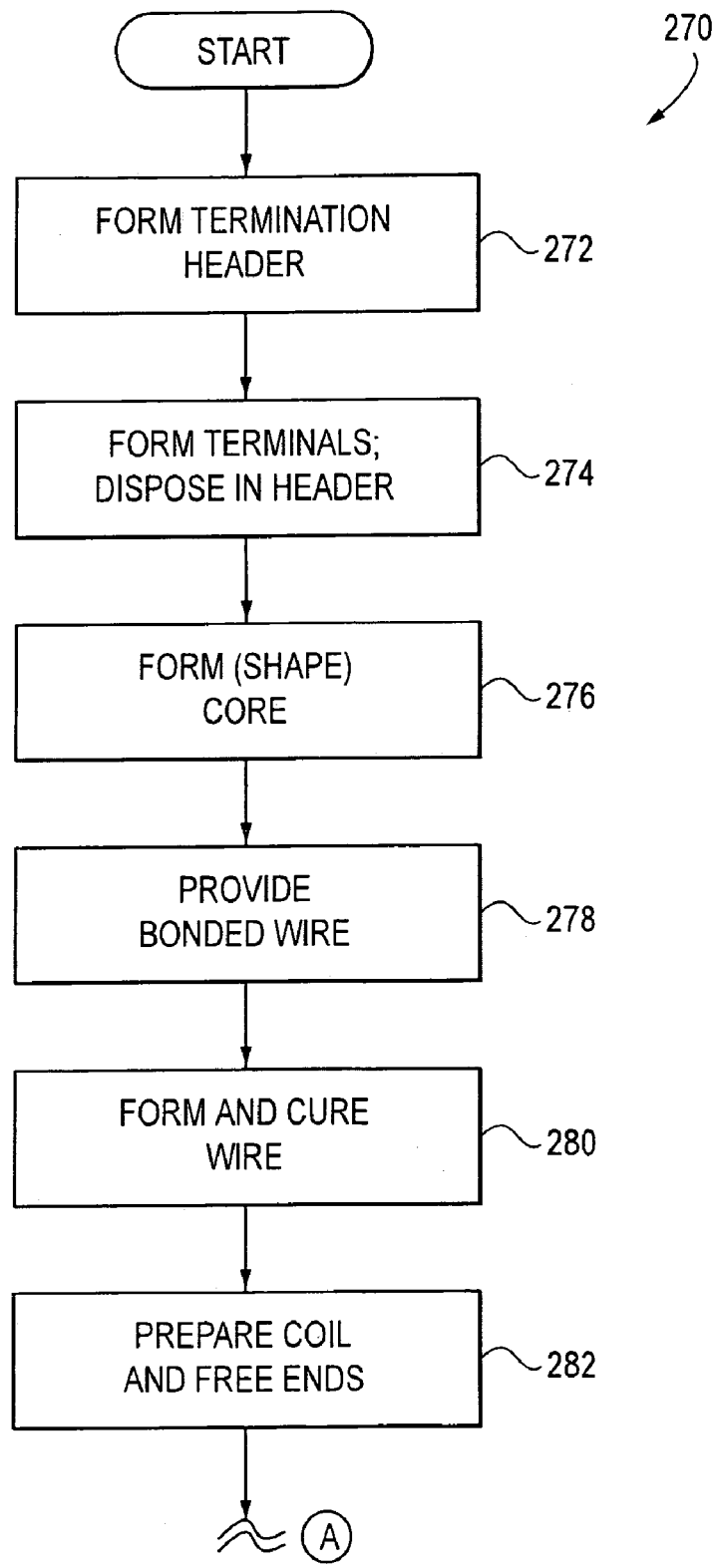
FIG. 2d (1 of 2)

(2 of 2)

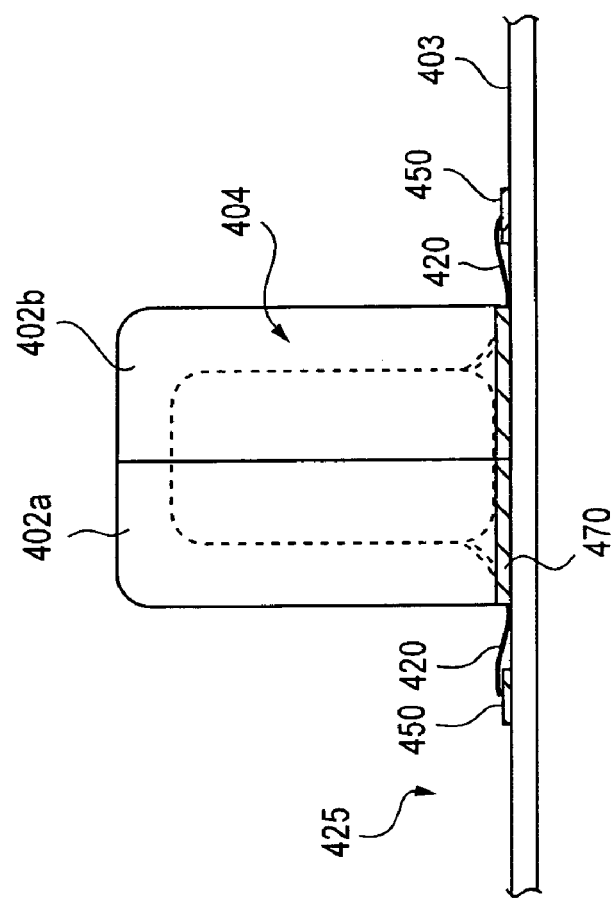

US 7,598,837 B2

FORM-LESS ELECTRONIC DEVICE AND METHODS OF MANUFACTURING

PRIORITY CLAIM

This application claims priority benefit of co-owned U.S. Provisional Patent Application Ser. No. 60/485,801 of the same title filed Jul. 8, 2003, incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of Invention

The present invention relates generally to electronic elements and particularly to an improved design and method of manufacturing miniature electronic components including transformers and inductive devices (e.g., "choke coils") without a bobbin or other forming component.

2. Description of Related Technology

As is well known in the art, inductive components are electronic devices which provide the property of inductance (i.e., storage of energy in a magnetic field) within an alternating current circuit. Inductors are one well-known type of inductive device, and are formed typically using one or more coils or windings which may or may not be wrapped around a magnetically permeable core. So-called "dual winding" inductors utilize two windings wrapped around a common core.

Transformers are another type of inductive component that are used to transfer energy from one alternating current (AC) circuit to another by magnetic coupling. Generally, transformers are formed by winding two or more wires around a ferrous core. One wire acts as a primary winding and conductively couples energy to and from a first circuit. Another wire, also wound around the core so as to be magnetically coupled with the first wire, acts as a secondary winding and conductively couples energy to and from a second circuit. AC energy applied to the primary windings causes AC energy in the secondary windings and vice versa. A transformer may be used to transform between voltage magnitudes and current magnitudes, to create a phase shift, and to transform between impedance levels.

Ferrite-cored inductors and transformers are commonly used in modern broadband telecommunications circuits to include ISDN (integrated services digital network) transceivers, DSL (digital subscriber line) modems and cable modems. These devices provide any number of functions including shielding, control of longitudinal inductance (leakage), and impedance matching and safety isolation between broadband communication devices and the communication lines to which they are connected. Ferrite-core inductive device technology is driven by the need to provide miniaturization while at the same time meeting performance specifications set by chip-set manufactures and standards bodies such as the ITU-T. For example, in DSL modems, microminiature transformers are desired that can allow a DSL signal to pass through while introducing a minimal THD (total harmonic distortion) over the DSL signal bandwidth. As another example, dual-winding inductors can be used in telephone line filters to provide shielding and high longitudinal inductance (high leakage).

"Shaped" Devices

A common prior art ferrite-cored inductive device is known as the EP-core device. EP and similar devices are well known in the prior art. For example, U.S. Pat. No. 5,489,884 to Heringer, et al. issued Feb. 6, 1996 and entitled "Inductive Electric Component" discloses an inductive electric component including a coil body having coil body flanges defining a winding space, and contact pin strips integrally formed onto the coil body flanges, the contact pin strips having extensions and having free ends with undercuts formed therein being limited outwardly by the extensions. U.S. Pat. No. 5,434,493 to Woody, et al. issued Jul. 18, 1995 and entitled "Fixed core inductive charger" discloses an EP-core device, as well as other shaped core devices, including EE and RS devices. Other similar well-know devices include inter alia so-called EF, ER, RM, and pot core devices. See, e.g., the pot core device is described in U.S. Pat. No. 5,952,907 to McWilliams, et al. issued Sep. 14, 1999 and entitled "Blind Hole Pot Core Transformer Device."

FIG. 1 illustrates a representative prior art EP transformer arrangement, and illustrates certain aspects of the manufacturing process therefore. The EP core of the device 100 of FIG. 1 is formed from two EP-core half-pieces 104, 106, each having a truncated semi-circular channel 108 formed therein and a center post element 110, each also being formed from a magnetically permeable material such as a ferrous compound. As shown in FIG. 1, each of the EP-core half-pieces 104, 106 are mated to form an effectively continuous magnetically permeable "shell" around the windings 112, the latter which are wound around a spool-shaped bobbin 109 which is received on the center post element 110. The precision gap in ground on the ferrite post 110 can be engineered to adjust the transfer function of the transformer to meet certain design requirements. When the EP core device is assembled, the windings 112 wrapped around the bobbin 109 also become wrapped around the center post element 110. This causes magnetic flux to flow through the EP core pieces when an alternating current is applied to the windings. Once the device is assembled, the outer portion of the EP cores self-enclose the windings to provide a high degree of magnetic shielding. The ferrous material in the core is engineered to provide a given flux density over a specified frequency range and temperature range.

The bobbin 109 includes a terminal array 114 (aka "header") generally mounted to the bottom of the device 100, with the windings 112 penetrating through the truncated portions 116 of the half-pieces 104, 106, the terminal array 114 being mated to a printed circuit board (PCB) or other assembly. Margin tape (not shown) may also be applied atop the outer portions of the outer winding 112 for additional electrical separation if desired.

For each core shape and size, various differing bobbins are available. The bobbins themselves (in addition to the other elements of the parent device) have many different characteristics; they can provide differing numbers of pins/terminations, different winding options, different final assembly techniques, surface mount versus through-hole mount, etc. For example, U.S. Pat. No. 6,587,023 to Miyazaki, et al. issued Jul. 1, 2003 and entitled "Electromagnetic Induction Device" discloses a flat bobbin with coaxially aligned through-holes. U.S. Pat. No. 5,350,980 to Dye, et al. issued Sep. 27, 1994 and entitled "Nonlinear Inductor with Magnetic Field Reduction" discloses, inter alia, a dumbbell-shaped ferrite bobbin carrying an inductive coil.

Magnet wire is commonly used to wind transformers and inductive devices (such as inductors and transformers, including the aforementioned EP-type device). Magnet wire is made of copper or other conductive material coated by a thin polymer insulating film or a combination of polymer films such as polyurethane, polyester, polyimide (aka "Kapton™"), and the like. The thickness and the composition of the film coating determine the dielectric strength capability of the wire. Magnet wire in the range of 31 to 42 AWG is most commonly used in microelectronic transformer applications, although other sizes may be used in certain applications.

The prior art EP and similar inductive devices described above have several shortcomings. A major difficulty with EP devices is the complexity of their manufacturing process, which gives rise to a higher cost. The use of a bobbin (also called a "form" or "former") increases not only the cost, but size and complexity of the final device, since the bobbin is retained within the device upon completion of the manufacturing process. The bobbin consumes space within the device which could be used for other functionality, or conversely eliminated to give the final device a smaller size and/or footprint.

Also, the EP core half pieces themselves are relatively costly to mold and produce. For example, by the time the EP transformer is assembled and tested, its volume production cost is high (currently ranging from approximately $0.50 to –$0.70). It would be desirable to produce a device having performance characteristics at least equivalent to those of an EP transformer, but at a significantly lower cost.

Yet a further disability of "headered" shaped core devices such as that of FIG. 1 is the use of the header or terminal array 114 itself. This component adds additional cost and manufacturing steps, and at minimum increases the vertical profile of the device 100. In certain applications, it would be desirable to utilize a lower profile configuration without a header if possible.

Bonded Wire

Bonded wire is a well-established product/process that is used to produce so-called "air coils". Air coils themselves are inductors, and are typically use in RFID tags, voice coils, sensors, and the like. The materials and manufacturing equipment for producing bonded wire are commercially available from a variety of sources known to the artisan of ordinary skill.

Bonded wire is essentially an enamel-coated wire having additional coating applied (by either the wire vendor or the device manufacturer) to the outer surfaces of the enamel. Generally, during winding, the bonded wire coating may be activated (normally by heat, although other types of processes including radiation flux, chemical agents, and so forth) to cause the coated wires to stick/bond together. This approach provides certain benefits and cost economies in the context of electronic component production.

Accordingly, there is a need for an improved electronic device, and a method of manufacturing the device, that does not require use of a bobbin or other form(er). Such an improved device would ideally utilize existing and well understood technologies in place of the bobbin/form(er) in order to simplify the manufacturing process and further reduce cost, yet still maintain the desirable electrical and physical properties of its bobbined counterpart while reducing the overall size and/or footprint of the device.

Furthermore, for certain applications, it would be highly desirable to obviate the header (terminal array) of the prior art from the shaped core device altogether.

SUMMARY OF THE INVENTION

The present invention satisfies the aforementioned needs by providing improved electronic inductive devices, and methods of manufacturing the same.

In a first aspect of the invention, an improved form-less electronic device is disclosed. The device generally comprises a core and at least one winding, the at least one winding being formed and disposed within the device without use of an internal bobbin. In one exemplary embodiment, the device comprises a bonded-wire coil formed to reside within a shaped core, the bonded wire of the coil obviating the use of an internal bobbin or other comparable structure. A termination element is disposed on the bottom of the device to permit termination of coil windings to the parent assembly (e.g., PCB).

In a second aspect of the invention, a multi-core device is disclosed. In the exemplary embodiment, the multi-core device comprises a plurality of form-less electronic inductive devices as described above disposed within a common termination header in end-to-end (or side-by-side) orientation, thereby economizing on PCB footprint.ABoth Pins with common signals are optionally consolidated, thereby reducing the required number of terminal leads as well.

In a third aspect of the invention, a termination header for use in terminating a form-less inductive device is disclosed. In one embodiment, the termination header comprises a molded assembly with inset SMT terminals which attaches to a single core of the device using standard gluing techniques. In another embodiment, the header is adapted to receive a plurality of cores adjacent one another.

In a fourth aspect of the invention, a method of manufacturing the above-referenced form-less electronic devices is disclosed. The method generally comprises: providing a termination header; providing a shaped core separated into at least two elements; providing a bonded winding comprising wire having ends; forming a shaped core assembly by disposing the winding within the core components such that the ends are exposed; coupling the shaped core assembly with a termination element having a plurality of terminals; and terminating the ends of said winding to ones of the terminals.

In a fifth aspect of the invention, an improved "direct assembly" form-less device is disclosed. In one embodiment, the device comprises a form-less inductive device as previously described, yet which mates directly with the parent assembly (e.g., PCB), thereby obviating the termination header. The free ends of the windings protrude from the device through an aperture formed in the underlying assembly. The ends are soldered to conductive pads present on the PCB substrate.

In a sixth aspect of the invention, a method of manufacturing the form-less and header-less inductive device previously described is disclosed. The method generally comprises: providing a shaped core separated into at least two elements; providing at least one length of wire having ends; forming the wire into a core winding having a plurality of turns, also comprising treating the wire so as to form the turns into a substantially unitary component; and disposing the winding within the core elements such that the ends of said winding are exposed for termination. In one exemplary embodiment, the wire comprises thermally activated bonding wire which is wound around a mandrel and then heated, thereby obviating the bobbin. The assembled device is then direct-assembled onto the PCB or other device as described above.

In a seventh aspect of the invention, a self-leaded electrical device adapted for surface mounting is disclosed, generally comprising a bobbin-less inductive element and a self-leaded termination element coupled to the inductive element, the self-leaded termination element comprising a plurality of terminal elements each adapted to receive at least one of the winding ends of the inductive winding thereon so as to permit surface mounting. In one exemplary embodiment, the termination element comprises a molded plastic header with terminal posts around which the core windings are wrapped.

In an eighth aspect of the invention, a low profile, low cost electronic assembly, is disclosed, generally comprising: a PCB having a first aperture formed therein and a plurality of contact pads formed thereon; and a bobbin-less inductive device having a shaped core with a second aperture formed therein and a winding having a plurality of free ends, the first and second apertures substantially communicating with each other such that the free ends pass through both apertures and are each terminated to ones of the contact pads. At least a portion of the winding is received within the second aperture, thereby permitting the inductive device to be reduced in overall (installed) height.

In a ninth aspect of the invention, a reduced footprint multi-core electronic assembly is disclosed. The assembly generally comprises a plurality of bobbin-less and headerless inductive devices disposed in substantially mated and in-line configuration. In one exemplary embodiment, the devices are disposed in adjacent, juxtaposed (side-by-side) fashion and direct-assembled to the parent device (e.g., PCB), thereby occupying the smallest possible footprint.

BRIEF DESCRIPTION OF THE DRAWINGS

The features, objectives, and advantages of the invention will become more apparent from the detailed description set forth below when taken in conjunction with the drawings, wherein:

FIG. 2a is an exploded perspective view of a first exemplary embodiment of the improved electronic device of the present invention.

FIG. 2b is a side plan view of the device of FIG. 2a.

FIG. 4b is a front plan view of another exemplary configuration of a "direct assembly" inductive device according to the invention, for use on PCBs or other equipment not having an aperture or recess.

FIG. 5 is a logical flow diagram illustrating one exemplary method of manufacturing the device of FIGS. 4-4a.

DETAILED DESCRIPTION OF THE INVENTION

Figure 1:
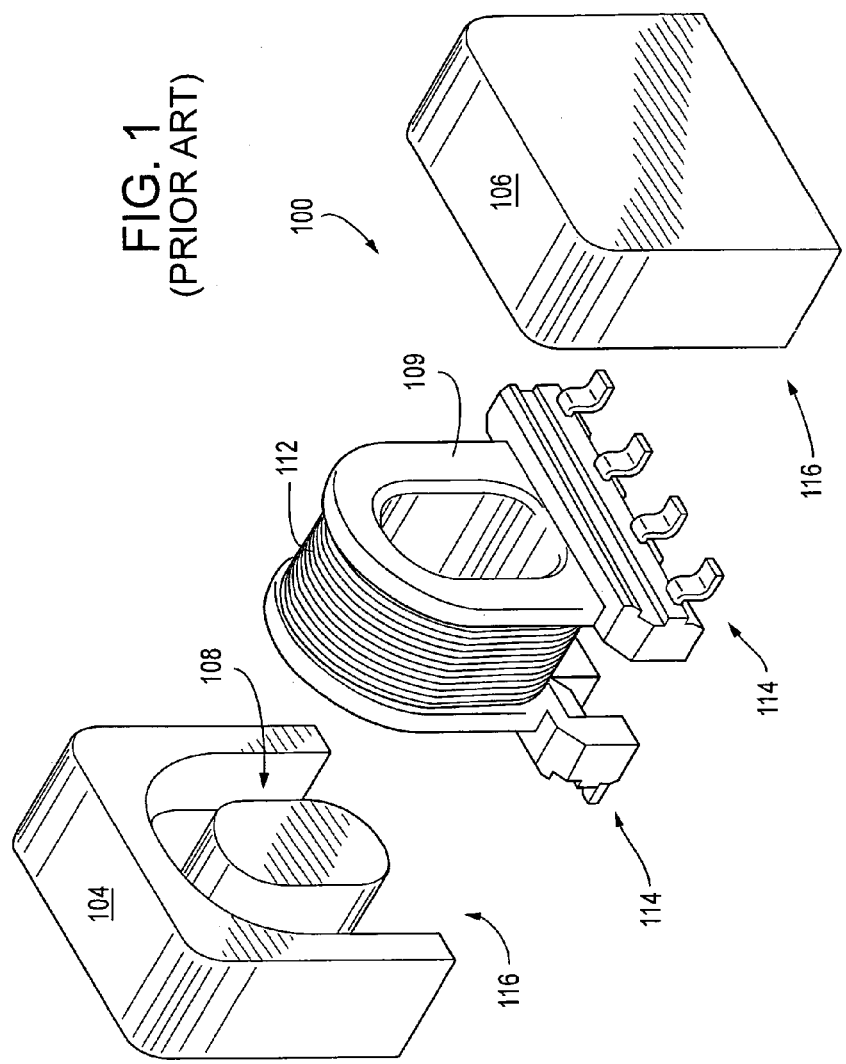
FIG. 1 is an exploded view of a typical prior art EP transformer design having a two-piece EP core and bobbin, illustrating the components thereof.

Reference is now made to the drawings wherein like numerals refer to like parts throughout.

As used herein, the term "inductive device" refers to any device using or implementing induction including, without limitation, inductors, transformers, and inductive reactors (or "choke coils".

As used herein, the terms "bobbin" and "form" (or "former") are used to refer to any structure or component(s) disposed on or within an inductive device which helps form or maintain one or more windings of the device.

As used herein, the term "signal conditioning" or "conditioning" shall be understood to include, but not be limited to, signal voltage transformation, filtering and noise mitigation, signal splitting, impedance control and correction, current limiting, and time delay.

As used herein, the term "digital subscriber line" (or "DSL") shall mean any form of DSL configuration or service, whether symmetric or otherwise, including without limitation so-called "G.lite" ADSL (e.g., compliant with ITU G.992.2), RADSL: (rate adaptive DSL), VDSL (very high bit rate DSL), SDSL (symmetric DSL), SHDSL or super-high bit-rate DSL, also known as G.shdsl (e.g., compliant with ITU Recommendation G.991.2, approved by the ITU-T February 2001), HDSL: (high data rate DSL), HDSL2: (2nd generation HDSL), and IDSL (integrated services digital network DSL), as well as In-Premises Phoneline Networks (e.g., HPN).

Overview

In one primary aspect, the present invention provides improved bobbin-less electronic apparatus and methods for producing the same. The electronic apparatus may be used in any number of electrical circuits including for example those used for signal conditioning or in DSL circuits. One significant benefit of winding the coil independent of a bobbin (or "former") is that the space normally taken up by the bobbin inside the device can be utilized for additional functionality, or the design made smaller in size and/or footprint.

Specifically, more winding space inside the device allows any of the following (or combination thereof) to be utilized in the design: (i) more winding turns can be used on a given design, therefore more inductance/performance can be achieved in a given form factor (i.e., higher winding density); (ii) alternatively, heavier gauge wire can be used and yet maintain the same number of turns, thereby providing other electrical performance benefits; (iii) the performance of a given design using a bobbin can be achieved in a smaller "bobbinless" design. Smaller devices are generally lower cost. In addition to the cost benefit, smaller size for a given performance also offers the end application space and footprint reduction benefits that can be very attractive in high-density applications.

In addition to the significant electrical design benefits, bobbinless designs offer other significant advantages, including the flexibility to terminate the windings of the device before or after core assembly, and the use of different termination approaches which take full advantage of the bobbinless design construction and manufacturing methodology.

Exemplary Apparatus

It will be recognized that while the following discussion is cast in terms of an exemplary shaped core transformer, the invention is equally applicable to other inductive devices (e.g., inductors) and core configurations. Conceivably, any device having a plurality of winding turns and requiring electrical insulation may benefit from the application of the approach of the present invention. Accordingly, the following discussion of the shaped core transformer is merely illustrative of the broader concepts.

Figure 2B:
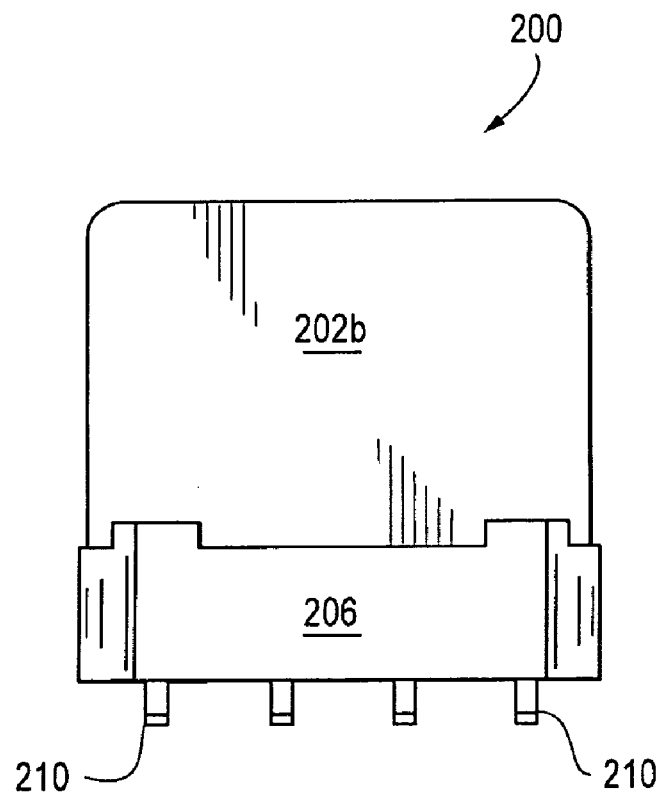
Figure 2C:
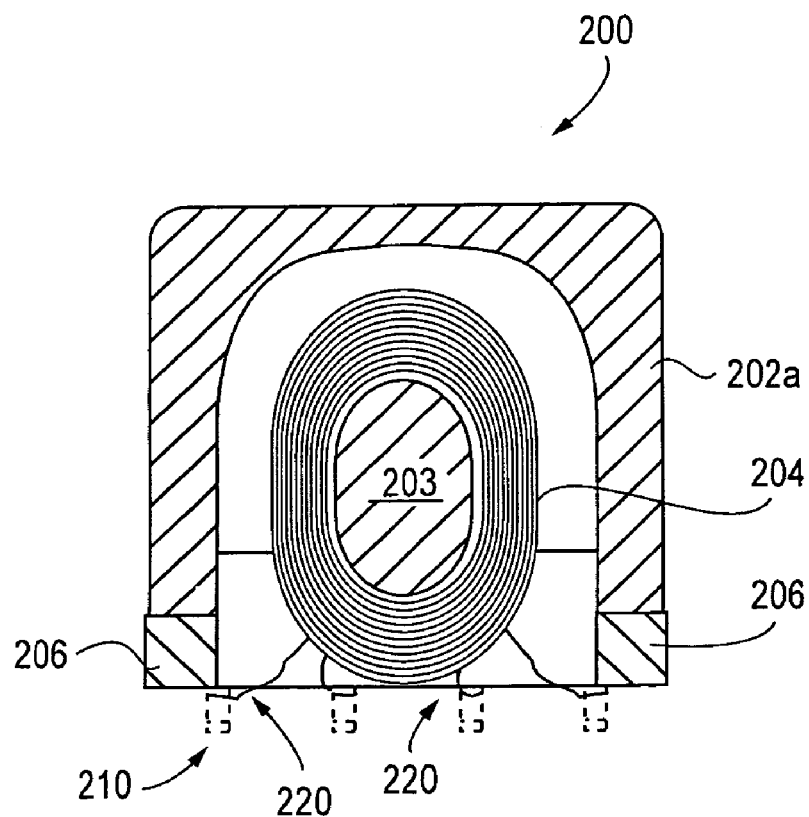
FIG. 2c is a cross-sectional view of the device of FIG. 2a, taken along line 2c-2c.

Referring now to FIGS. 2a-2c, an exemplary embodiment of a bobbinless (form-less) inductive device (e.g. shaped core transformer) is described. As shown in FIGS. 2a-2c, the device 200 generally comprises a core element 202, wound coil 204, and a termination element or header 206. The core element in the illustrated embodiment is "E-shaped" with an oval-shaped center leg 203; it will be recognized that various different shapes may be used (such as EF, EE, ER, and RM, and even pot core), however. In addition, it will be recognized that the core element and the wound coil together may be at any angle relative to the header. For example, FIG. 6 illustrates one embodiment where the "E-shaped" core element 602a, 602b and wound coil 604 is positioned such that the core's open plane is perpendicular to the printed circuit board plane on which the header is positioned. The core element 202 comprises two pieces 202a, 202b of similar configuration. The core is fashioned from a magnetically permeable material such as a soft ferrite or powdered iron, as is well known in the electrical arts. The manufacture and composition of such cores is well understood, and accordingly is not described further herein. The cores are assembled onto the wound coil 204 and the termination element 206.

In the illustrated embodiment, an adhesive is used to mate the core 202 to the molded polymer termination element 206, due primarily to ease of manufacturing and low cost. However, other techniques for fastening the two components (i.e., core 202 and termination element 206) together may be utilized. For example, metallic "spring" clips of the type well known in the art may be used. Alternatively, a frictional arrangement can be used as well, such as where two side risers (not shown) disposed lateral to the outer sides of the core elements 202a, 202b are formed as part of the termination element 206; the assembled core 202 is disposed atop the termination element 206 and then forced into frictional cooperation with the risers to maintain the core 202 in stationary position on the element. As yet another option, the core portions 202a, 202b may be cemented or bonded together, and the wires of the core in effect stretched taught and terminated (e.g., wire wrapped and/or soldered) to the terminals 210 of the element 206. Hence, the terminated wires act to maintain tension on the wound coil 204 (and therefore the core 202), thereby acting to maintain the core assembly in communication with the termination element 206. Different combinations of the foregoing may also be used as desired.

The termination element 206 includes a plurality (e.g., eight) terminals 210 for physical and electrical mating to another device, such as a PCB or the like. These terminals 210 may be of literally any configuration, including for example, substantially rectangular cross-section adapted for surface mount (SMT), circular or elliptical cross-section for through-hole mounting, ball-grid array, etc. They may also be notched or shaped to facilitate wire wrapping if desired. Furthermore, it will be appreciated that the termination element 206 may comprise a self-leaded arrangement (not shown) of the type described in co-owned U.S. Pat. No. 5,212,345 to Gutierrez issued May 18, 1993 entitled "Self leaded surface mounted coplanar header", or U.S. Pat. No. 5,309,130 to Lint issued May 3, 1994 and entitled "Self leaded surface mount coil lead form", both of which are incorporated herein by reference in their entirety. For example, in one embodiment, the termination element 206 is a molded polymer device having eight (8) self-leading terminals formed therein, upon which various of the conductors of the coil 204 are wound. FIG. 2e shows a first embodiment of an electronic device comprising self-leaded termination elements 250 according to the principles of the present invention. FIG. 2f shows a second embodiment of an electronic device comprising self-leaded termination elements 250 according to the principles of the present invention.

It is further recognized that the termination element 206 may take any number of different forms or configurations in terms of its shape. For example, the termination element 206 may comprise a substantially square, circular, or polygonal form, depending on the needs of the particular application. Additionally, the exact placement of the terminals 210 within the element 206 can be optimized based upon circuit placement and mounting considerations at the system level.

Also, if desired, the termination element may be obviated altogether through, e.g., the approach described subsequently herein with respect to FIGS. 4 and 4a, or alternatively direct bonding of the conductive terminals 210 to the core itself.

As shown in FIG. 2a, the wound coil 204 comprises one or more windings of wire which, when formed, is inserted between the core portions 202a, 202b and into the termination element 206. The coil windings consist of bonded wire of the type described previously herein, and is wound independent of an internal bobbin or form(er), such as on a removable die, winding mandrel or steel former. The shape of the coil is defined by the dimensions of the winding mandrel. In one exemplary embodiment, the winding mandrel comprises a polished steel shaft with a centrally disposed groove or recess. The groove/recess if formed by the extension of a selectively retractable pin or shaft. The bonded wire is held by a first of two small radial pins or dowels disposed adjacent the groove of the shaft. The bound wire source (e.g., spool) is then laterally aligned over the groove, and the shaft rotated to build up the winding coil 204. Once the winding is complete, the terminal end of the wire is then brought and held by a second radial pin disposed adjacent the other side of the groove. The winding is then heated (such as by blowing hot air over the mandrel, or heating the mandrel itself, etc.) so that the wires of the coil are bonded.

It will be recognized that many variations of this approach exist, such as where the shaft (mandrel) is stationary and the wire source rotated around the mandrel. Such winding techniques are well known in the mechanical arts, and accordingly not described further herein.

Additionally, it will be appreciated that different winding lay patterns may be used in order to achieve certain design objectives. For example, a substantially parallel lay pattern may provide the tightest spatial packing, thereby reducing the size of the winding as a whole. Alternatively, other lay patterns may provide the most desirable electrical and/or magnetic performance for certain applications. All such variations will be recognized by those of ordinary skill.

When the single or multiple winding has been completed, the retractable center pin on the winding mandrel (which forms the groove) is withdrawn allowing the formed and bonded coil to be removed, or drop due to gravity, and winding of a new coil can commence again.

In the exemplary embodiment, the bonded wire comprises 35AWG-42AWG bondable wire manufactured by the Bridgeport Insulated Wire Company of Bridgeport, Conn., although other manufacturers, configurations and sizes of wire may be used. The wire comprises round copper magnet wire with a polyurethane base coating. The polyurethane base coat has a polyamide (Kapton) and self-bonding overcoat. The wire of the illustrated embodiment complies with the NEMA MW29-C and IEC 317-35 international standards for wire, although this is not required. It will be understood, however, that suitable wire may be purchased and then subsequently coated (whether before, during, or after the mandrel forming process previously described) in order to produce the desired windings 204.

It will be recognized that the foregoing "form-less" wire bonding process may be applied to (i) a single continuous winding; (ii) multiple windings bonded into a unitary physical group or structure; or (iii) single or multiple windings bonded into two or more discrete groups which may or may not themselves ultimately be bonded together using the aforementioned bonding techniques or others. Hence, the present invention contemplates various winding/bonding configurations which may be driven for example by dielectric withstand requirements, the need for multiple windings within the same core, and so forth.

Furthermore, while bonded wire is preferred, the device 200 may also utilize a wound coil formed and coated as described generally in co-owned U.S. Pat. No. 6,642,847 issued Nov. 4, 2003 and entitled "Advanced Electronic Miniature Coil and Method of Manufacturing", which is also incorporated herein by reference in its entirety. Specifically, a Parylene coating is applied to a plurality of individual wires formed into a layer or group using for example a vapor or vacuum deposition process. Parylene is chosen for its superior properties and low cost; however, certain applications may dictate the use of other insulating materials. Such materials may be polymers such as for example fluoropolymers (e.g., Teflon, Tefzel), polyethylenes (e.g., XLPE), polyvinylchlorides (PVCs), or conceivably even elastomers. Additionally, dip or spray-on coatings may be used to form the wound coil 204 of the illustrated invention.

Note that in the present embodiment, the free ends 220 of the windings (see FIG. 2c) are stripped of insulation prior to winding, after winding, or during soldering (so-called "solder stripping"), using techniques well known in the art. This stripping facilitates the formation of good electrical contacts with the terminals 210 to which the free ends 220 are mated.

Because the coil is wound independent of an internal bobbin or form(er), additional space inside the device 200 is available in its final assembled configuration. This additional space permits the inclusion of greater turns on a given core design, therefore advantageously increasing the inductance and/or performance of a given shaped core. Conversely, the additional space created by obviating the bobbin allows the use of heavier gauge wire, while maintaining the same number of turns, thereby providing other electrical performance benefits such as reduced DC resistance and insertion loss.

Furthermore, the additional space may be used to decrease the overall size and/or footprint of the device 200, as well as its weight. Smaller cores not only have a cost benefit (due to use of less material), but also offer the end application space benefits, which is especially attractive in high-density applications. For example, the larger prior art (bobbined) counterpart device having the required electrical performance simply may not fit in certain applications. It can be appreciated that these design variations, as well as other design variations available uniquely due to the "bobbin-less" or form-less feature of the invention, may be used independently or in combination with each other.

Figure 2D:
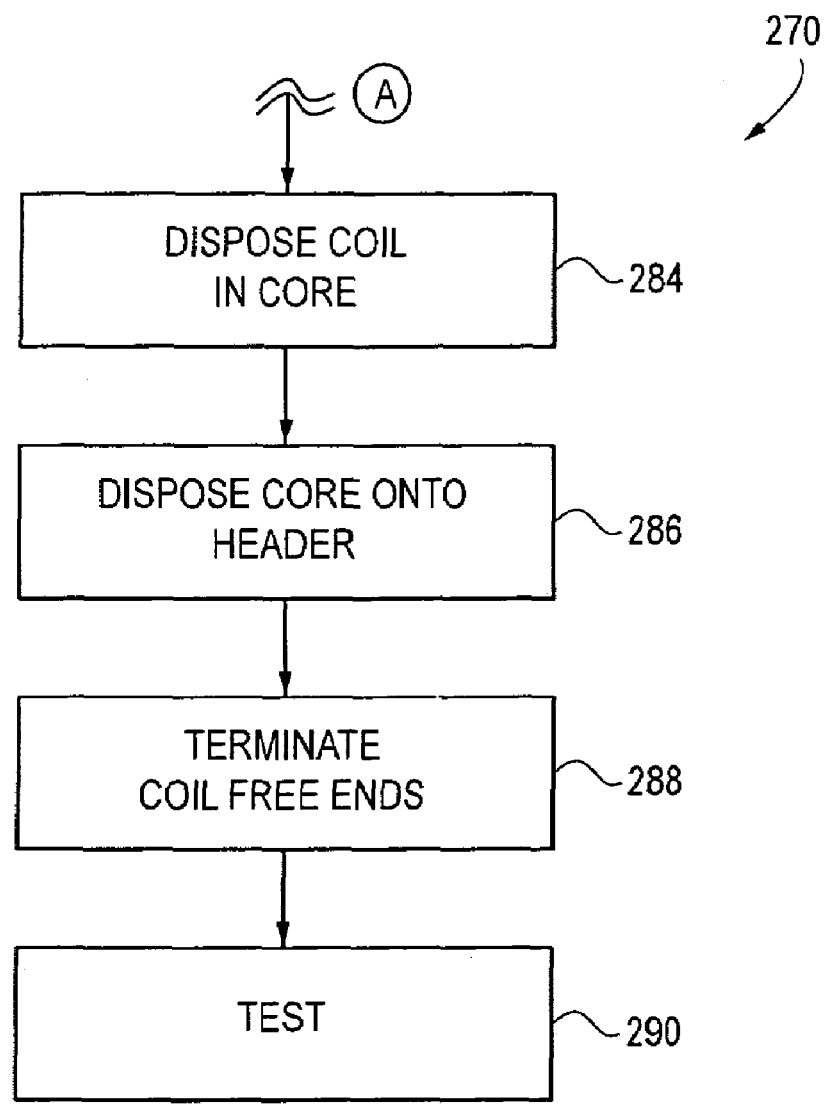
FIG. 2d is a logical flow diagram illustrating one exemplary method of manufacturing the device of FIGS. 2a-2c.
Figure 2E:
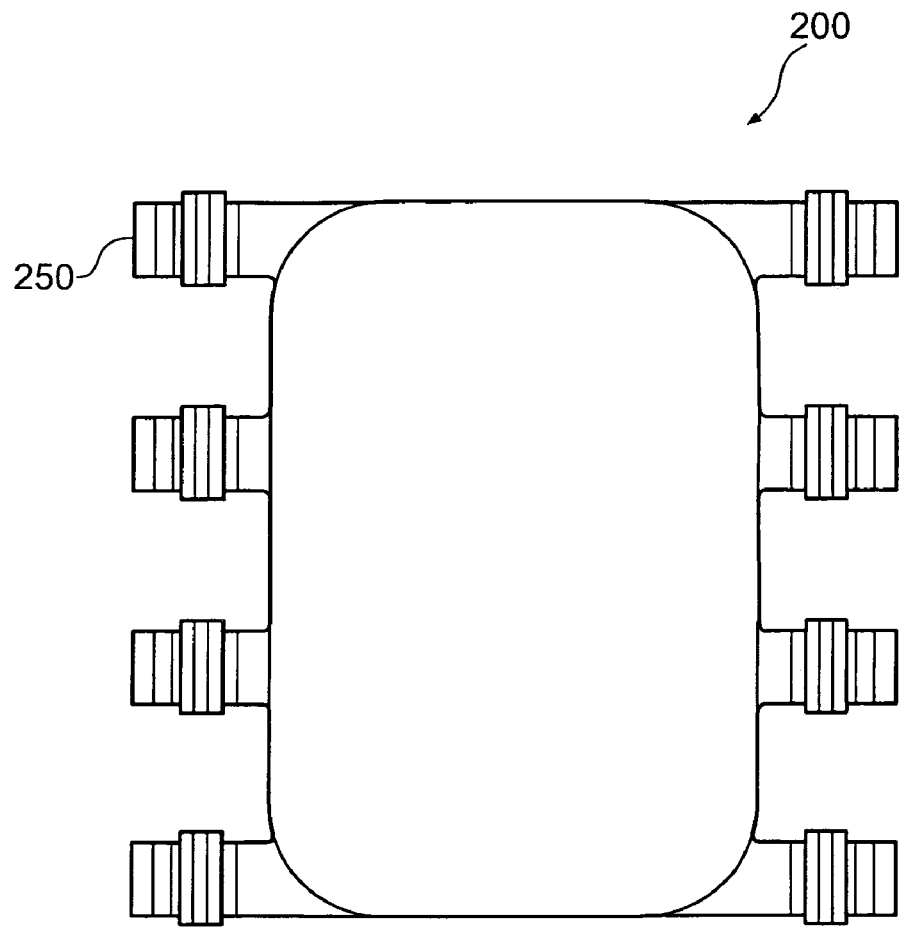
FIG. 2e is a top elevational view of a first exemplary embodiment of a self-leaded improved electronic device of the present invention.
Figure 2F:
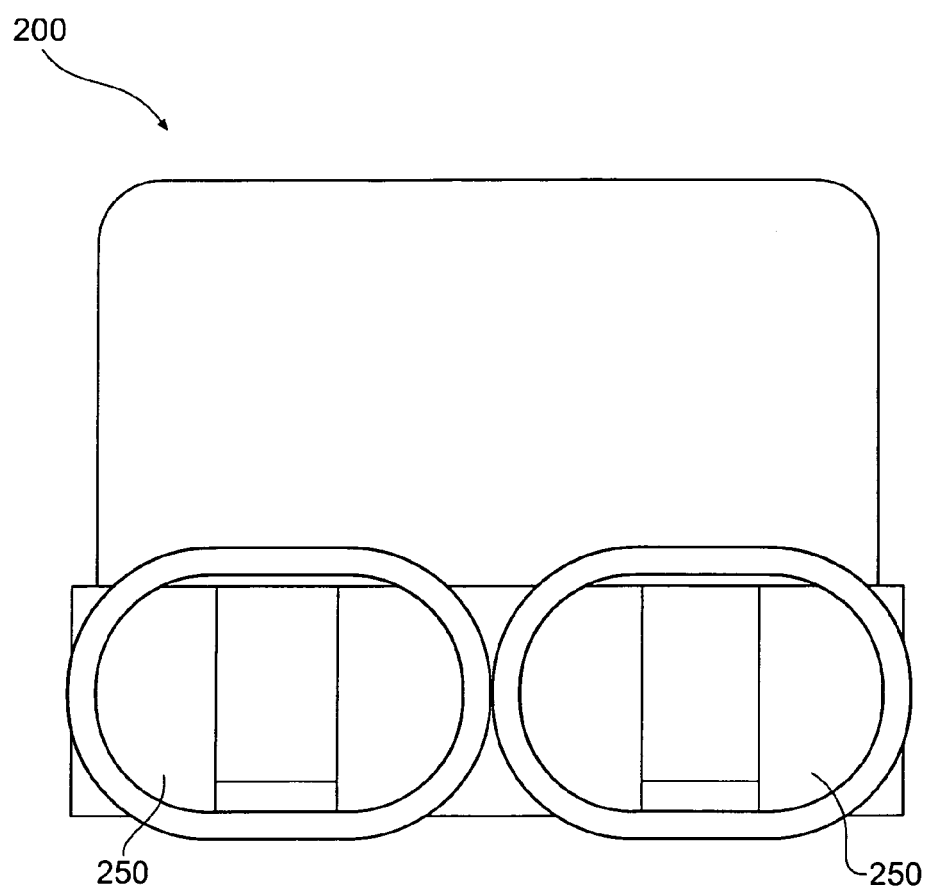
FIG. 2f is an end elevational view of a second exemplary embodiment of a self-leaded improved electronic device of the present invention.

FIG. 2d illustrates one exemplary method 270 of manufacturing the inductive device 200 of FIGS. 2a-2c. It will be appreciated that while various steps are described in terms of forming or manufacturing components of the inductive device 200, such steps may be obviated by alternatively procuring the pre-manufactured component from a third party.

As shown in FIG. 2d, the method 270 generally comprises first forming a termination header 206 (step 272), including forming the terminals 210 and disposing them within the header (step 274). Next, a shaped core 202 is provided, separated into its component elements 202a, 202b (step 276). Bonded wire is next provided in sufficient quantity (step 278). Per step 280, the bonded wire is then formed on an external form, and cured (e.g., heated, exposed to chemical agents, irradiated, etc.). The cured coil 204 is then removed from the form and prepared, which includes properly positioning the free ends of the windings and stripping them if required (step 282). The prepared coil is then disposed between the core halves, the latter being optionally bonded together if desired (step 284). The assembled core is then disposed onto the termination element 206 using adhesive (step 286), and the free ends 220 terminated to their respective terminals 210 (step 288). The device is then optionally tested per step 290.

Figure 3:
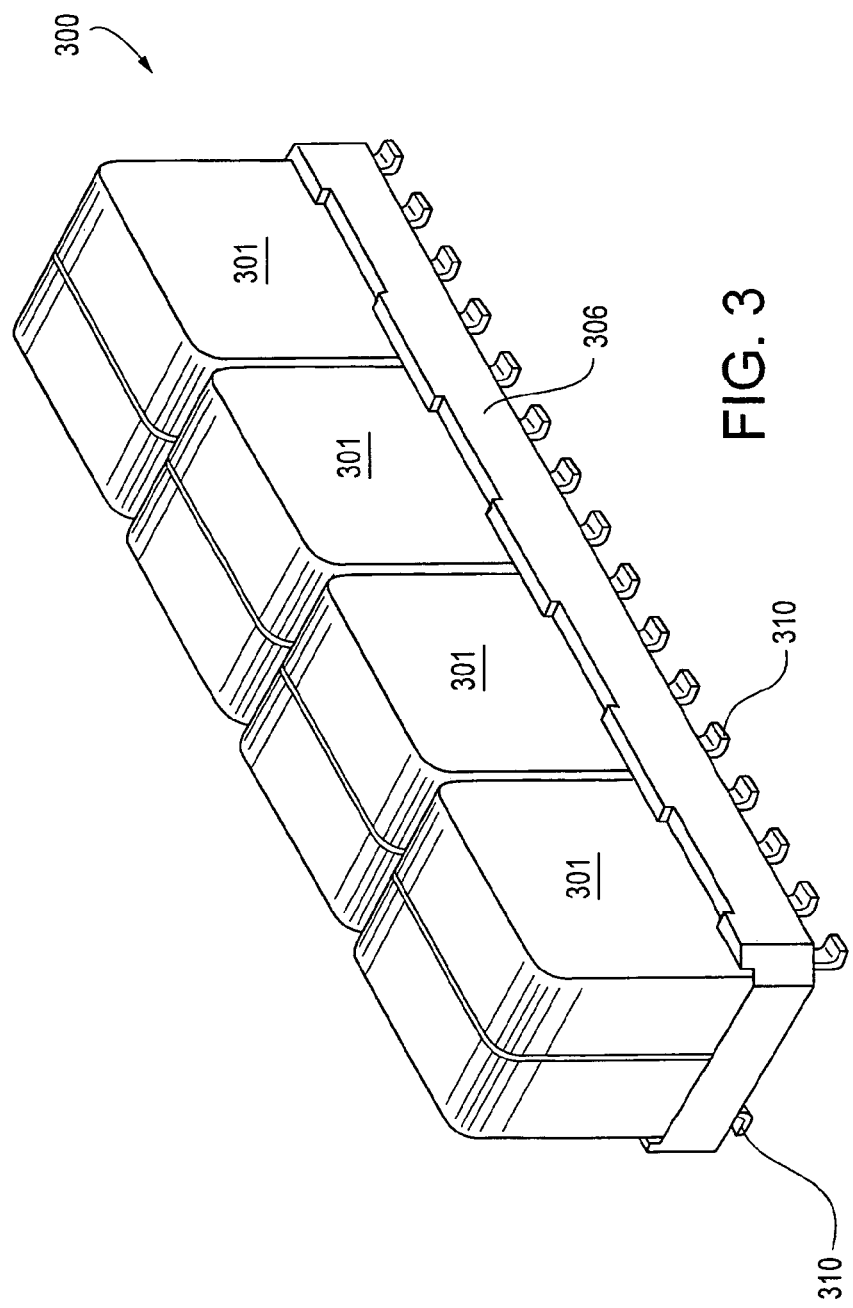
FIG. 3 is a perspective view of second embodiment of the form-less device of the present invention, having multiple inductive cores and a unitary termination header.

Referring now to FIG. 3, another embodiment of the inductive device of the present invention is described. FIG. 3 shows a device assembly 300 having multiple inductive devices 301 (e.g., four) ganged together in an array which is disposed within a combined termination header 306. In the illustrated embodiment, the devices 301 are disposed with their longer dimension being co-linear, although other orientations (e.g., side-by-side) and array formations may be used. The multiple core assembly 300 of FIG. 3 provides many advantages over single core assemblies. Specifically, multiple cores 301 on a single header 306 reduce and/or eliminate the spacing or stand-off required between cores on a single header in conventional designs. This spacing represents wasted PCB area, since the individual devices can be placed only so close to one another. The space-conserving benefits of the invention are magnified as greater numbers of devices are ganged; e.g., eight, twelve, and so forth.

Multiple core termination headers 306 also reduce the number of terminations to the printed circuit board (PCB), as common pins or terminals 310 on a discrete design may be consolidated onto single termination points in a multiple core header design such as that of FIG. 3.

Furthermore, there are economies associated with the fabrication of a single termination header 306 as opposed to two or more discrete ones.

Direct Assembly Soldering Termination Method

In addition to the foregoing design benefits, the form-less inductive devices of the present invention provide the ability to terminate the wires before or after core assembly, rather than requiring the termination of wires to pins on the bobbin prior to core assembly as required under the prior art. The flexibility to terminate the wires before or after coil assembly not only allows for flexibility within the manufacturing process (e.g., the permutation of the order of steps in making the device 200), but also permits at least two distinct termination approaches: (i) the use of termination elements (headers) as described with respect to FIGS. 2a-2c above; and (ii) direct assembly soldering. The latter technique is now described in detail with respect to FIGS. 4 and 4a. While the following discussion is cast in terms of EP-type cores, it can be appreciated that the invention is in no way limited to such core designs.

Figure 4:
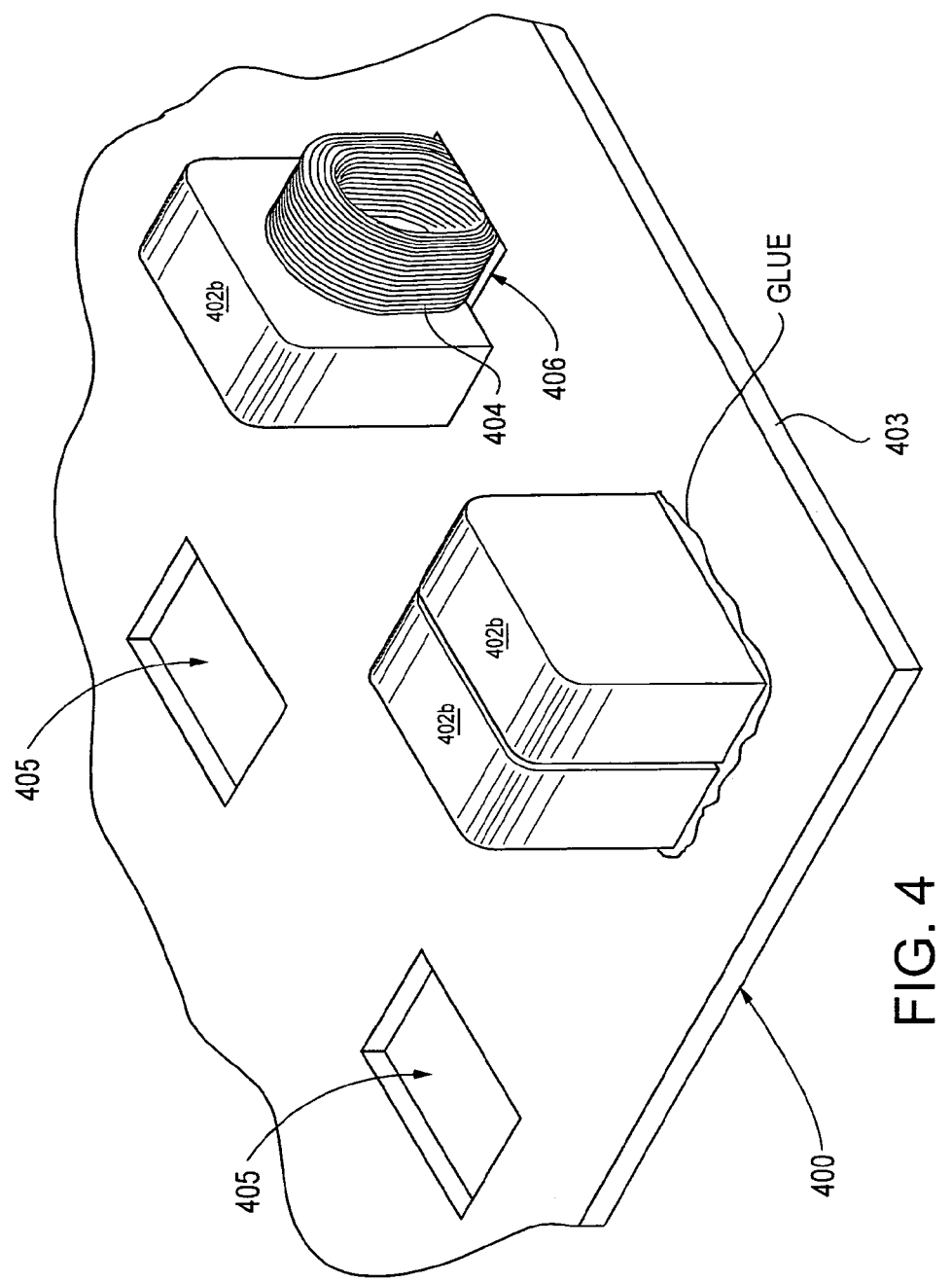
FIG. 4 is a top perspective view of another embodiment of the form-less electronic device of the invention adapted for direct assembly to a parent device (e.g., PCB).
Figure 4A:
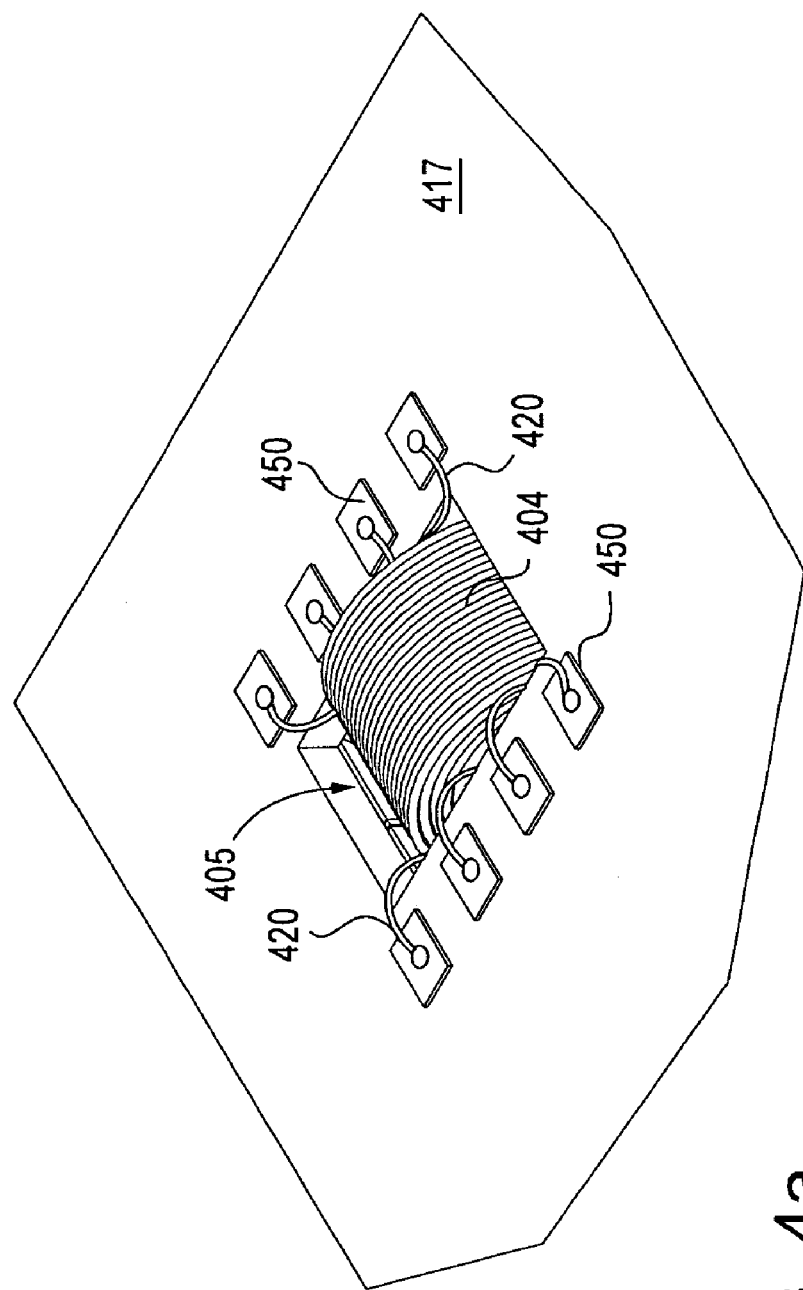
FIG. 4a is a bottom perspective view of the device of FIG. 4, illustrating one exemplary termination scheme used therewith.

As shown in FIGS. 4 and 4a, the direct assembly soldering approach of the present invention advantageously eliminates the need for bobbin(s) or header(s). In this method, the inductive device 400 is directly mounted and/or assembled onto the final assembly or parent device, which may be for example a PCB 403 or other electronic component. In the exemplary embodiment, the assembly or parent device includes one or more apertures 405 formed therein adapted to receive the free conductor ends 420 of the device coil 404. The inductive device 400 may be glued or bonded to the PCB 403 or other assembly to which it is mounted as shown in FIG. 4, or alternatively friction-fit, such as by providing the outer periphery of the core portions 402a, 402b with a tapered or ridged construction (not shown), such that the device 400 in effect "snaps" into the PCB aperture 405. Yet other techniques for maintaining the device 400 in a substantially constant orientation with respect to the parent assembly 403 may be used as well, such as dowel pins, clips, etc.

As shown in FIG. 4a, the free ends 420 of the coil windings are brought through the aperture 405 and terminated directly to PCB contact pads 450 disposed on the underside 417 of the PCB 403. In the illustrated embodiment, this termination comprises soldering of the free ends 420 to the pads 450 (such as via a hand or wave soldering process), although other approaches for termination may also be used. It will be further appreciated that the invention is in no way limited to the use of contact pads 450 such as those shown in FIG. 4a; raised or embedded terminals, pins, etc. may be used as well consistent with the invention. The illustrated embodiment, however, has the advantage of simplicity and ease of manufacture. For example, the depth of the coil 404 in the aperture 405 can be adjusted as desired (whether through device design, PCB thickness, or use of an intervening spacer, not shown) to permit use of a wave soldering process which is highly efficient in providing mass termination of electrical contacts. To this end, the interior edges 452 of the aperture 405 can be notched if desired (not shown) in order to retain the routed free winding ends 420 in the desired orientation with respect to the pads 450 before such mass soldering is performed.

It will also be appreciated that while the embodiment of FIGS. 4 and 4a utilizes pads 450 disposed on the disengaged or underside of the PCB 403, such pads may also be disposed on the upper (engaged) side 425 ("same side") of the PCB 403. In one embodiment (FIG. 4b), the free ends 420 of the windings are simply routed out from under the device 400 within the thickness of the adhesive/bonding agent 470 applied between the device 400 and PCB 403 (i.e., the adhesive is applied in sufficient thickness to permit insulated routing of the leads to pads 450 disposed on the upper side 425. In another embodiment, the leads 420 are routed out through notches formed in the core elements 402a, 402b. Other approaches may be used as well.

Similarly, it will be recognized that the "same side" pad arrangement described above may be used with or without the PCB aperture or recess 405 previously discussed. For example, as shown in FIG. 4b, the core elements 402 may be configured such that the winding (when assembled) does not protrude below the plane of the base of the core elements, thereby obviating the need for such recess or aperture 405. This approach, however, makes the overall installed height of the device 400 on the PCB (or other device) somewhat higher than if the recess/aperture 405 is utilized. This "aperture-less" configuration, however, may be desirable in cases where the PCB or other equipment to which the device 400 is mounted does not (or cannot) have apertures 405.

Note also that when mounted to a substrate or PCB, at least portions of the inductive device(s) 400 of the present invention may also optionally be encapsulated using an epoxy or polymer encapsulant (such as silicone) as is well known in the art. The devices may also be shielded against EMI as is well known in the art, such as by using a well known tin or metallic Faraday shield.

The foregoing "direct assembly" approach exemplified in FIGS. 4-4a not only eliminates the cost of both a bobbin and termination header 206 in the device 400 (thereby providing an appreciably simpler and less costly device for the same electrical performance), but also advantageously reduces the overall installed height of a given inductive device design. The approach of FIG. 4b similarly has no bobbin or header, yet in effect trades greater vertical height for the absence of a PCB aperture or recess to accommodate the lower portion of the winding.

It will also be recognized that the direct assembly approach generally described above can be used with multiple cores, akin to the configuration of FIG. 3 previously discussed. Specifically, multiple cores can be "ganged" together or placed in side-by-side fashion on the parent device (e.g., PCB) so as to minimize the footprint used by these devices. The devices 400 may be physically coupled together if desired (not shown), such as by bonding them together via adhesive or the like, using a metallic clip arrangement, using a molded plastic frame which holds the devices in constant relationship, etc. As yet another alternative, the left and right core pieces 402a, 402b for the interior devices can be fabricated as a unitary component (i.e., a left core piece of one device 400 which has a right core piece for the immediately adjacent device 400 as an integral part thereof), with the two end core pieces of the assembly being of the type shown in FIG. 4. In this fashion, when the cores are assembled, the individual devices 400 are inherently physically attached.

Figure 4C:
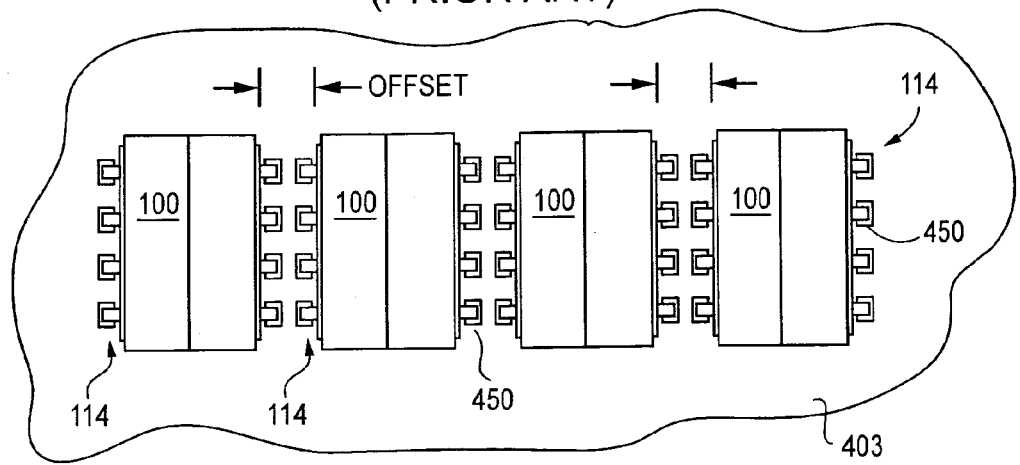
FIG. 4c is a top plan view of a typical prior art multi-core arrangement disposed on a PCB, illustrating its comparatively large footprint.
Figure 4D:
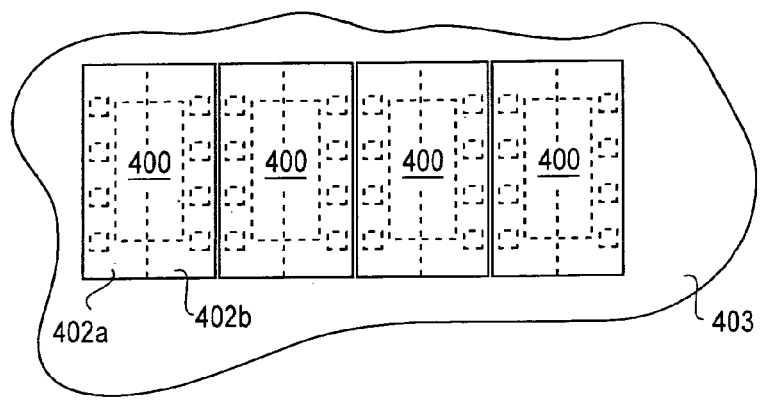
FIGS. 4d and 4e are top and bottom plan views, respectively of an exemplary "ganged" multi-core arrangement (on a PCB) according to the present invention, illustrating its reduced footprint as compared to that of the prior art arrangement of FIG. 4c.
Figure 4E:
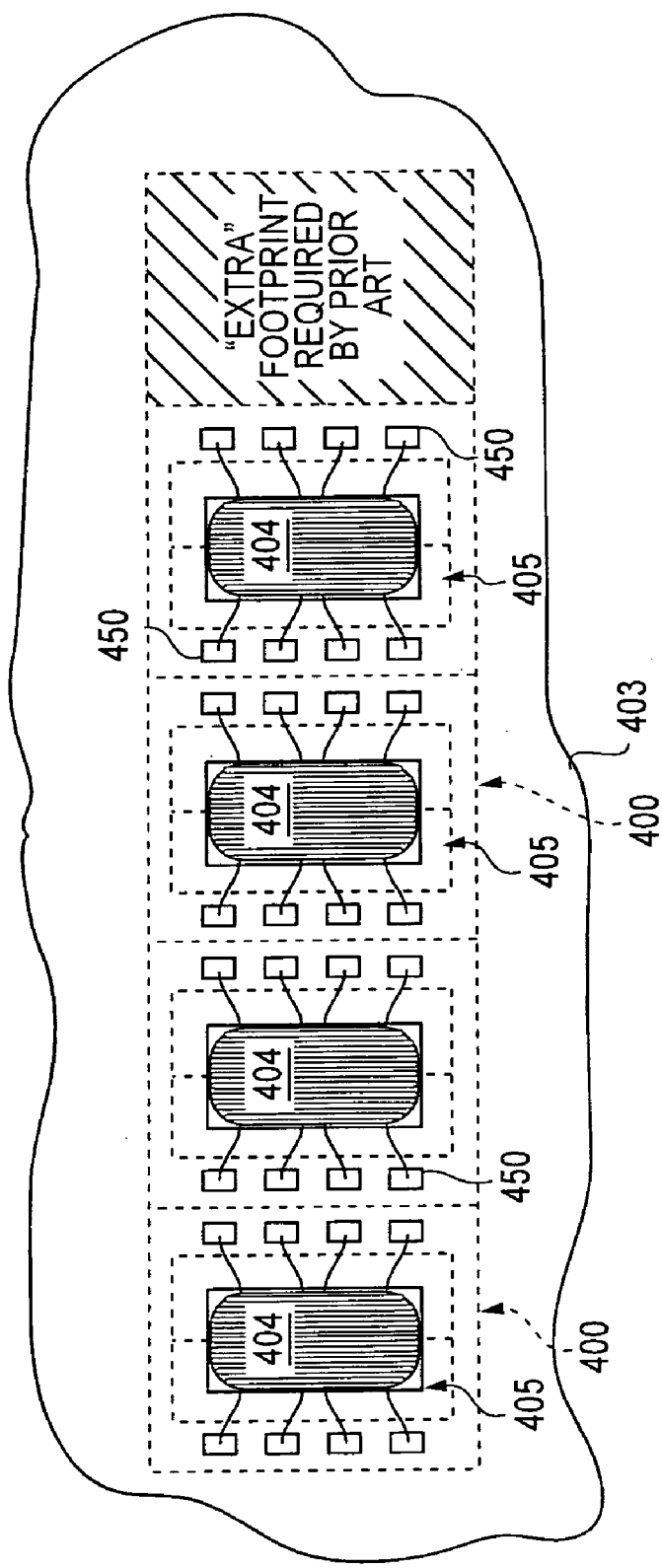

Under prior art approaches to multiple shaped cores (FIG. 4c), each of the bobbined and headered EP cores would need to be spaced somewhat from one another to prevent interference between their footprints (e.g., surface mount terminals). Contrast the exemplary "direct assembly" configuration of the present invention (FIGS. 4d and 4e), wherein the individual devices 400 may be literally mated with one another, either side-by-side as in FIG. 4d, or end-to-end (not shown). This reduces the overall footprint of the aggregated devices 400 (whether in length as shown in FIG. 4e, or width when the devices are disposed end-to-end).

Furthermore, the aperture-less approach of FIG. 4b can be implemented in a multi-device assembly akin to that of FIGS.

4d and 4e (except with no PCB apertures 405), again trading greater vertical height for the absence of the apertures/recesses.

Figure 5:
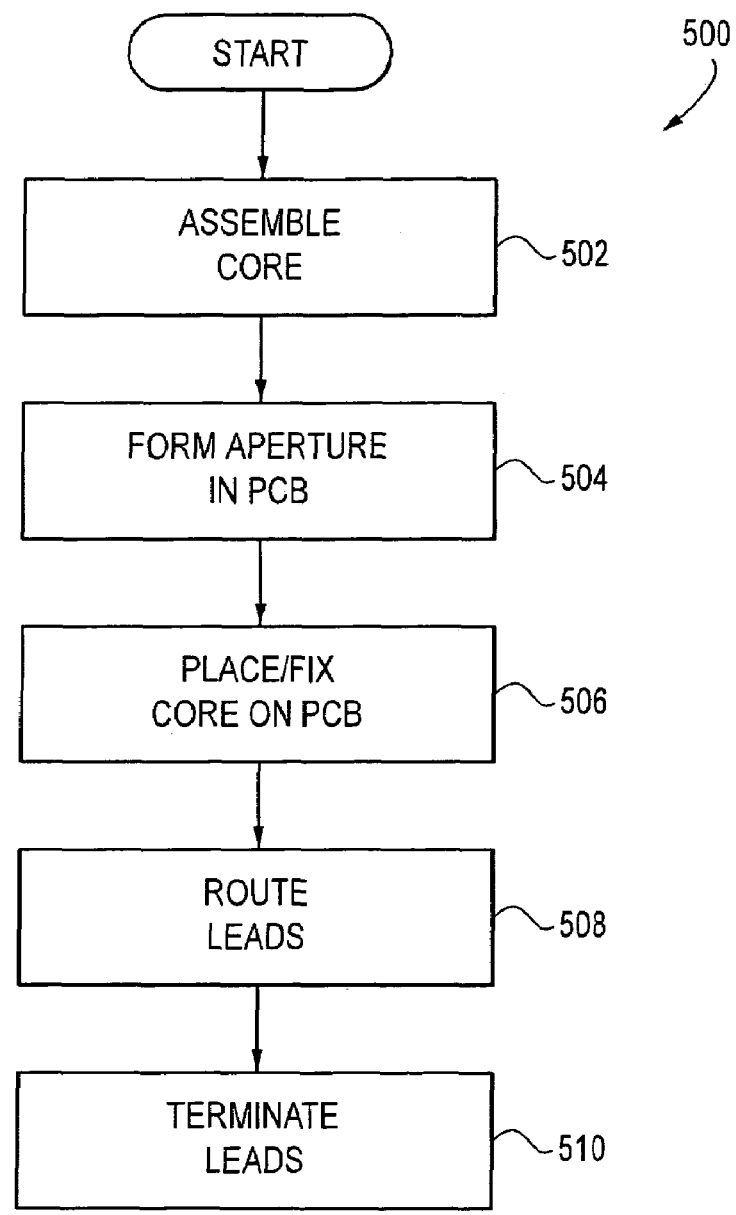

Referring now to FIG. 5, a method 500 of direct assembly of EP cores is described in detail. In the first step 502, the process previously described with respect to FIG. 2d herein is utilized to form the core of the device (specifically, steps 276-284). The aperture 405 or recess adapted to accept the protruding coil (and the lower contacting portion of the core, if desired) is then formed in the PCB per step 504 (or the PCB acquired with such feature already present). Next, the core is adhered, mated to, or bonded to the PCB if required (step 506). As previously described, such mating or bonding may be accomplished via adhesive, silicone-based compounds, use of a "snap in" configuration, etc. Termination is then completed to the pads 450 disposed on the side of the PCB opposite to the side on which the device 400 sits; i.e. the free ends of the coil wire(s) are routed from the core assembly through the aperture (step 508) and terminated on the pads 450 (step 510).

Additionally, in another embodiment of the method, the coil 404 may be pre-positioned within the aperture (and optionally terminated to the pads 450 first) before the core elements 402a, 402b are "sandwiched" around the coil, and adhered to one another and/or the PCB 403.

Other Embodiments

Figure 6A:
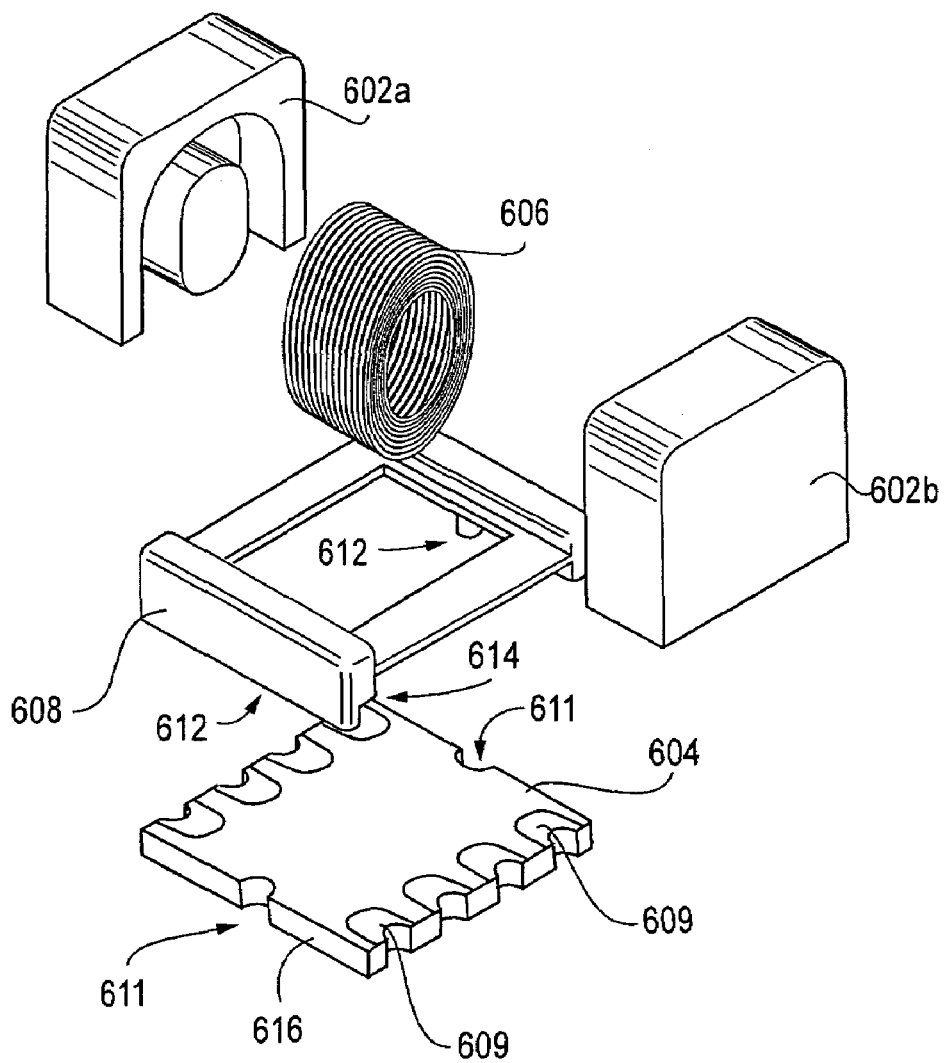
FIG. 6a is an exploded perspective view of another embodiment of the inductive device of the invention, illustrating the use of a substrate and interface element.
Figure 6B:
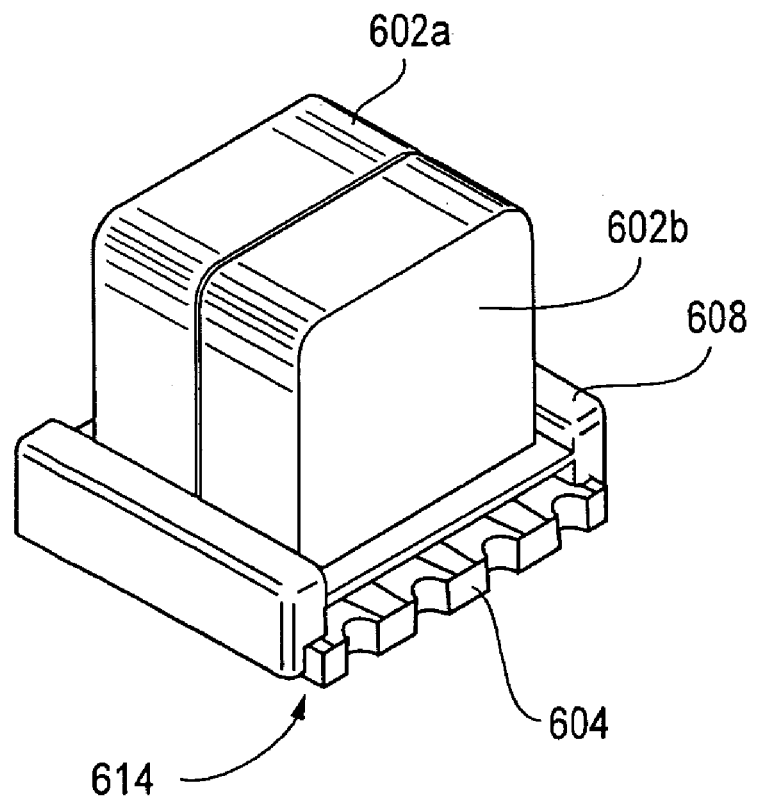
FIG. 6b is a perspective view of the device of FIG. 6a fully assembled.
Figure 6C:
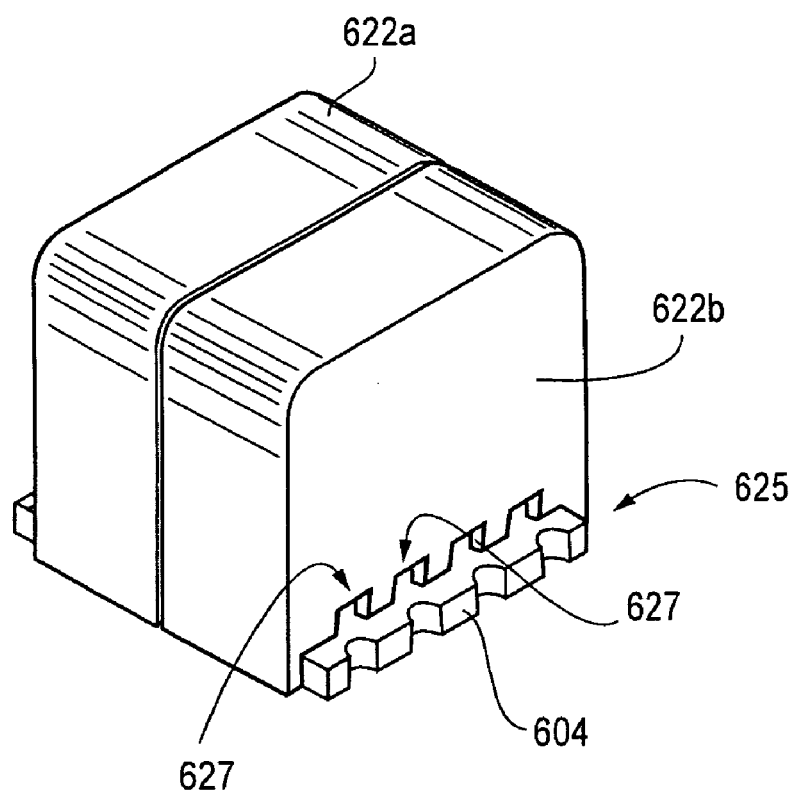
FIG. 6c is an exploded perspective view of yet another embodiment of the inductive device of the invention, illustrating a simplified structure without an interface element.
Figure 6D:
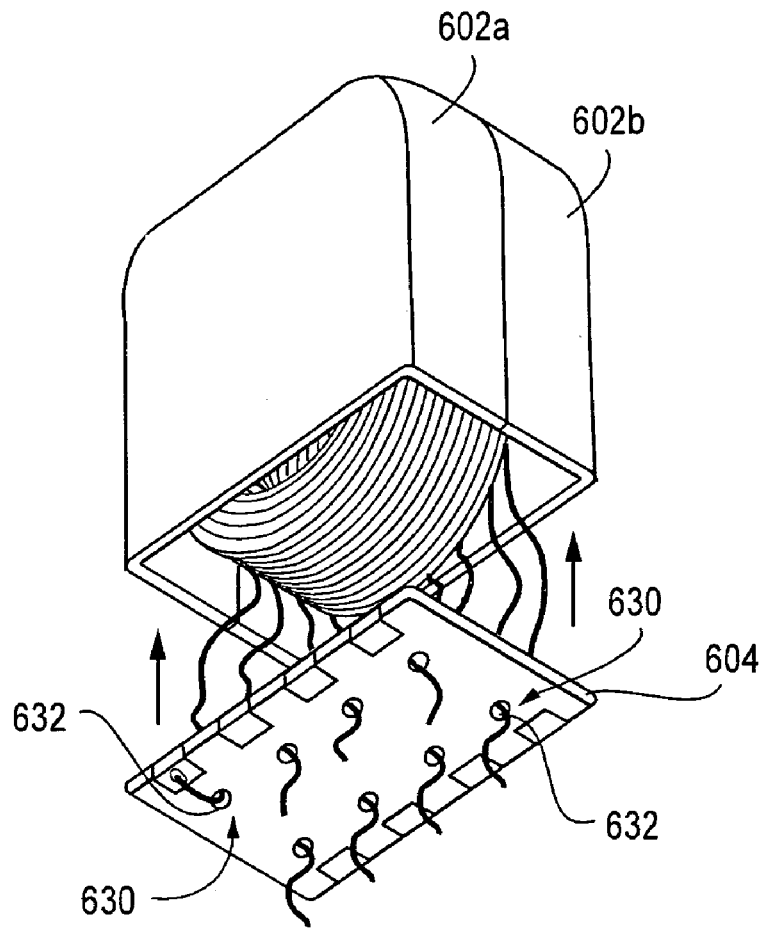
FIG. 6d is an exploded perspective view of still another embodiment of the inductive device of the invention.
Figure 6E:
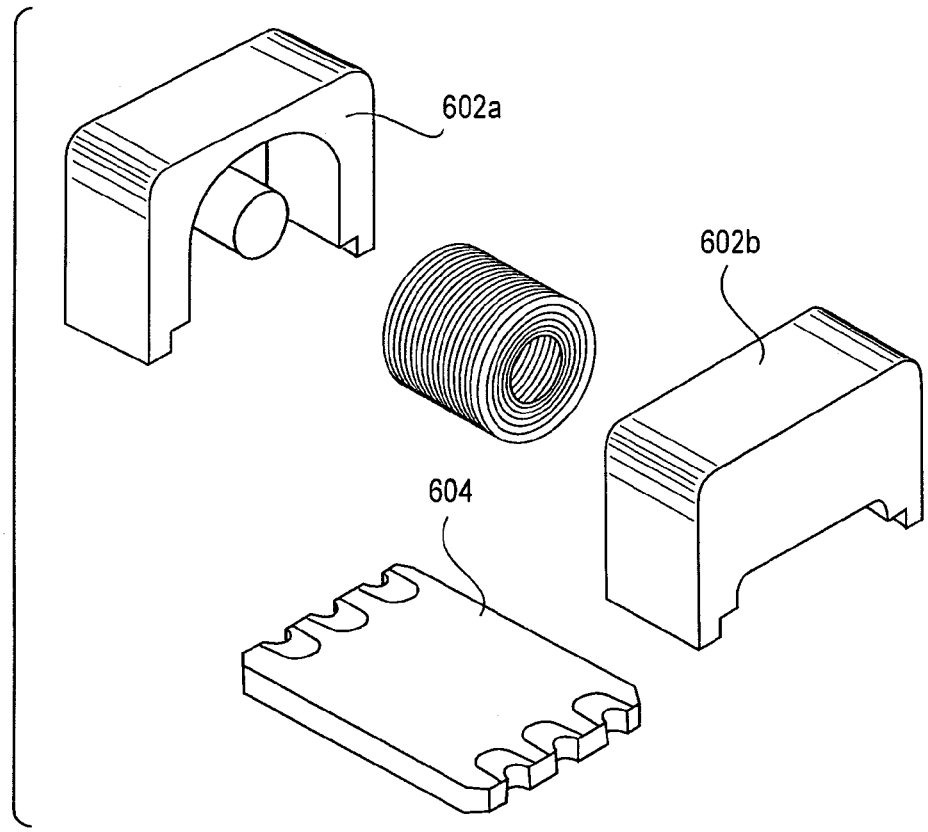
FIGS. 6e and 6f illustrate still another embodiment of the inductive device of the invention.
Figure 6F:
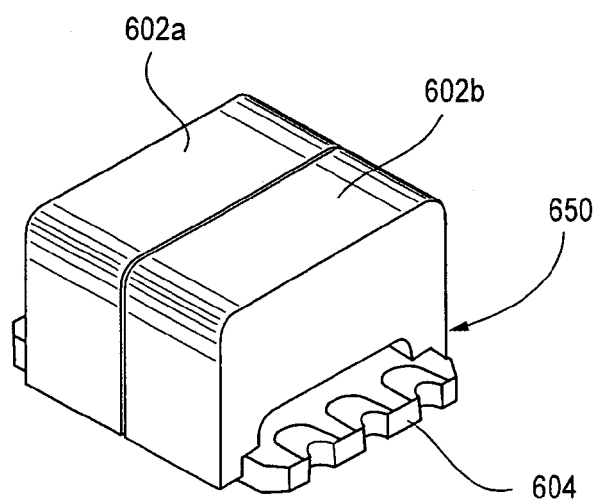

Referring now to FIGS. 6a and 6b, yet another embodiment of the "formerless" inductive device of the present invention is described. As shown in FIG. 6a, this device 600 includes a core assembly 602 with two core elements 602a, 602b and is generally similar to those previously described with respect to FIGS. 2a-2c, yet instead of using a header to terminate the windings of the core, the windings 606 are terminated to a substrate 604 such as a PCB. In the illustrated configuration, the terminal ends of the windings 606 are soldered to the pads 609 or traces of the substrate 604 (which may be disposed on the upper and/or lower surfaces of the substrate 604); however, welding (such as using standard electronics welding techniques known to those of ordinary skill) may be substituted if desired.

A conventional PCB section is chosen as the substrate in the illustrated embodiment for low cost; i.e., such PCBs are ubiquitous in manufacturing, and have very low per unit costs since, inter alia, many can be formed simultaneously.

The device 600 of FIG. 6a also comprises an interface element 608 which electrically separates and mechanically locates the core 602 and windings 606 on top of the substrate 604. The interface element 608 of the present embodiment is formed of a polymer (e.g., low cost plastic) fabricated using injection, transfer, or other common molding techniques, although other materials and formation techniques may be substituted if desired. The substrate 604 optionally includes one or more apertures 611 which cooperate with corresponding pins 612 on the interface element underside which permit registration of the interface element 608, although other means may be used to mechanically align the device 600 with respect to the substrate 604. For example, the edge features 614 that cooperate with the substrate edges 616 (also shown in FIG. 6a) may be used alone or in conjunction with the aforementioned apertures/pins to provide the desired alignment.

In yet another embodiment (FIG. 6c), the lower portion of each of the core elements are selectively extended to eliminate the cost and labor associated with the interface element 608 of the embodiment of FIG. 6. Specifically, one variant uses two core halves 622a, 622b each with an extended skirt or lower portion 625 adapted to receive the substrate 604, the core halves each with individually formed (or cut) apertures 627 through which the winding conductors are routed, thereby allowing termination of the winding ends to the substrate 604. The lower portion of the core hence provides the mechanical registration otherwise provided by the interface element 608 of the embodiment of FIG. 6a. Alternatively other means for providing the desired mechanical alignment may be used, such as forming or machining the core portions 622a, 622b with one or more small alignment pins that cooperate with apertures formed on the substrate 604.

In another variant (FIG. 6d), a plurality (e.g., eight) of perforations or apertures 630 are formed in the substrate 604, with the insulated conductors routed through the apertures 630 to contact pads or traces 632 on, e.g., the bottom of the substrate. These contact pads or traces, or others in electrical communication therewith, act as an electrical interface to the parent device (e.g., motherboard).

In still another embodiment (FIG. 6e and 6f), the substrate 604 is partly recessed into the bottom portion of the core elements 602a, 602b. The winding leads (not shown) can then be routed either out through the gap 650 formed on the sides between the core elements and the substrate, through apertures formed in the substrate, or even directly onto contacts or pads on the substrate upper surface under the winding (i.e., within the footprint" of the core). The substrate 604 may also be outfitted with electrical terminals of the type well known in the art if desired, such as by adhering them directly to the substrate, or inserting them through apertures formed in the substrate.

It will be further appreciated that although described in the context of a single inductive device, the techniques described above can also be readily extended to multi-inductor devices such as those of FIG. 3. For example, multiple devices 600 of the type shown in FIGS. 6a-6f can be mated to a common substrate 604 and interface element 608, such as in the "row" configuration of FIG. 3, or alternatively in another pattern (such as e.g., in an rectangular or square array). Myriad other configurations will be recognized by those of ordinary skill given the present disclosure.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A reduced profile, reduced cost form-less surface mount inductive device adapted for mass terminated solder operations comprising:

a shaped ferrous core element having first and second elements adapted for mating to one another, said first and second elements forming a winding channel therein when so mated, said elements further forming an aperture communicating with said channel;

a bonded wire winding having a plurality of turns and disposed at least partly within said channel, said winding further comprising at least two ends which are routed though said aperture; and a terminal array comprising a substantially planar bottom surface disposed proximate to said core and having a plurality of electrically conductive terminals associated therewith, said plurality of electrically conductive terminals protruding from said bottom surface and adapted for surface mating of said terminals to corresponding traces or pads disposed on the substantially planar surface of a PCB, said at least two ends of said winding being in electrical communication with ones of said terminals;

wherein said inductive device includes no former or bobbin for said winding, said absence of said former or bobbin reducing the required size and cost of said shaped ferrous core as compared to device having said former or bobbin; and wherein said bonded wire winding does not protrude below said substantially planar bottom surface of said terminal array, thereby allowing for said mass termination of said at least two ends to said ones of said terminals.

2. The device of claim 1, wherein said shaped core comprises a ferrite "E" core having a center post, said first and second elements comprising substantially vertical core halves which substantially bifurcate said center post.

3. The device of claim 1, wherein substantially all of said plurality of turns of said bonded winding are each bonded via an insulative coating to adjacent ones of said winding turns.

4. The device of claim 1, wherein said plurality of turns are bonded via a vacuum deposition process.

5. A reduced profile, reduced cost form-less surface mount inductive device adapted for mass terminated solder operations comprising:

a shaped ferrous core element having first and second elements adapted for mating to one another, said first and second elements forming a winding channel therein when so mated, said elements further forming an aperture communicating with said channel;

a bonded wire winding having a plurality of turns and disposed at least partly within said channel, said winding further comprising at least two ends which are routed through said aperture; and a mounting header, comprising:
  a body having at least one aperture therein, said aperture adapted to at least partially contain said bonded wire winding, said at least two ends of said winding extending there through;
  a substantially planar bottom surface; and
  a plurality of electrically conductive terminals protruding from said bottom surface of said mounting header and adapted for surface mating to traces or pads disposed on the substantially planar surface of a PCB, said at least two ends of said winding being in electrical communication with ones of said terminals;

wherein said inductive device includes no former or bobbin for said winding, said absence of said former or bobbin reducing the required size and cost of said shaped ferrous core as compared to device having said former or bobbin.

6. The device of claim 5, wherein said shaped core comprises a ferrite "E" core having a center post, said first and second elements comprising substantially vertical core halves which substantially bifurcate said center post.

7. The device of claim 5, wherein substantially all of said plurality of turns of said bonded winding are each bonded via an insulative coating to adjacent ones of said winding turns.

8. The device of claim 5, wherein said plurality of turns are bonded via a vacuum deposition process.

9. A reduced profile, reduced cost form-less inductive device adapted for mass terminated solder operations comprising:

a plurality of shaped ferrous core elements, each having first and second elements adapted for mating to other first and second elements, said first and second elements forming a winding channel therein when so mated, said elements further forming an aperture communicating with said channel;

a bonded wire winding having a plurality of turns and disposed at least partly within said channel, said winding further comprising at least two ends which are routed through said aperture; and a terminal array comprising a bottom surface disposed proximate to said plurality of shaped ferrous core elements and having a plurality of electrically conductive terminals associated therewith, said plurality of electrically conductive terminals protruding from said bottom surface and adapted for mating of said terminals to corresponding traces or pads disposed on a PCB, said at least two ends of said winding being in electrical communication with ones of said terminals;

wherein said inductive device includes no former or bobbin for said winding, said absence of said former or bobbin reducing the required size and cost of said shaped ferrous core elements as compared to devices having said former or bobbin; and wherein said bonded wire winding does not protrude below said bottom surface of said terminal array, thereby allowing for said mass termination of said at least two ends to said ones of said terminals.

10. The device of claim 9, wherein each of said plurality of shaped ferrous core elements comprises a ferrite "ER" core having a substantially circular center post.

11. The device of claim 9, wherein said terminal array is bonded to at least one of said plurality of shaped ferrous core elements using an adhesive.

12. The device of claim 9, wherein at least a portion of said plurality of shaped ferrous core elements are bonded together using an adhesive.

13. The device of claim 9, wherein at least a portion of said plurality of electrically conductive terminals comprises a substantially circular cross-section.

14. The device of claim 13, wherein said terminal array comprises a polygonal form.

15. The device of claim 14, wherein said bonded wire winding comprises a wire gauge between and including 35 American Wire Gauge (AWG) to 42 AWG.

16. The device of claim 9, wherein said bonded wire winding comprises multiple windings bonded into a unitary physical structure.

17. The device of claim 9, wherein said plurality of shaped ferrous core elements are ganged together in an array.

18. The device of claim 17, wherein said plurality of shaped ferrous core elements are ganged together in a multiplicity of formations.

19. A form-less inductive device adapted for mass terminated solder operations comprising:

a plurality of shaped ferrous core elements mated to one another, said plurality of shaped ferrous core elements forming at least one winding channel when so mated, said plurality of shaped ferrous core elements also collectively forming at least one aperture communicating with said at least one channel;

a bonded wire winding having a plurality of turns and disposed at least partly within said at least one winding channel, said winding further comprising at least two ends which are routed through said aperture; and a mounting header, comprising:
   a body having at least one aperture therein, said aperture adapted to at least partially contain said bonded wire winding, said at least two ends of said winding extending therethrough;
   a bottom surface; and
   a plurality of electrically conductive terminals protruding from said bottom surface of said mounting header and adapted for mating to traces disposed on a substantially planar surface of a PCB, said at least two ends of said winding being in electrical communication with ones of said terminals;

wherein said inductive device includes no former or bobbin for said winding, said absence of said former or bobbin reducing the required size and cost of said shaped ferrous core as compared to a device having said former or bobbin.

20. The device of claim 19, wherein said plurality of shaped ferrous core elements each comprise a ferrite "ER" core having a substantially circular center post.

21. The device of claim 20, wherein said terminal array is bonded to at least one of said plurality of shaped ferrous core elements using an adhesive.

22. The device of claim 21, wherein at least a portion of said plurality of shaped ferrous core elements are bonded together using an adhesive.

23. The device of claim 22, wherein at least a portion of said plurality of electrically conductive terminals comprises a substantially circular cross-section.

24. The device of claim 23, wherein said body comprises a polygonal form.

25. The device of claim 24, wherein said bonded wire winding comprises a wire gauge between and including 35 AWG to 42 AWG.

26. The device of claim 25, wherein said bonded wire winding comprises multiple windings bonded into a unitary physical structure.

27. The device of claim 26, wherein said plurality of shaped ferrous core elements are ganged together in an array.

28. The device of claim 27, wherein said plurality of shaped ferrous core elements are ganged together in a multiplicity of formations.

29. The device of claim 28, wherein substantially all of said plurality of turns of said bonded winding are each bonded via an insulative coating to adjacent ones of said winding turns.

30. The device of claim 29, wherein said plurality of turns are bonded via a vacuum deposition process.

31. The device of claim 30, wherein said plurality of conductive terminals are integrally molded within said body.

32. A form-less inductive device comprising:
a plurality of shaped ferrous core elements mated to one another, said plurality of shaped ferrous core elements forming at least one winding channel when so mated, said plurality of shaped ferrous core elements also collectively forming at least one aperture communicating with said at least one channel;

a bonded wire winding having a plurality of turns and disposed at least partly within said channel, said winding further comprising at least two ends which are routed through said aperture; and a terminal array comprising a bottom surface disposed proximate to at least one of said core elements and having a plurality of electrically conductive terminals associated therewith, said plurality of electrically conductive terminals protruding from said bottom surface and adapted for mating of said terminals to a PCB, said at least two ends of said winding being in electrical communication with ones of said terminals;

wherein said inductive device includes no former or bobbin for said winding, said absence of said former or bobbin reducing the required size and cost of said shaped ferrous core elements as compared to device having said former or bobbin; and wherein said bonded wire winding does not protrude below said bottom surface of said terminal array, thereby allowing for said mass termination of said at least two ends to said ones of said terminals.

33. The device of claim 32, wherein said plurality of shaped ferrous core elements each comprise a ferrite "ER" core having a substantially circular center post.

34. The device of claim 33, wherein said bonded wire winding comprises multiple windings bonded into a unitary physical structure.

35. The device of claim 34, wherein said plurality of shaped ferrous core elements are ganged together in an array.

36. The device of claim 35, wherein said plurality of shaped ferrous core elements are ganged together in a multiplicity of formations.

37. The device of claim 36, wherein substantially all of said plurality of turns of said bonded winding are each bonded via an insulative coating to adjacent ones of said winding turns.

38. A form-less inductive device comprising:
a plurality of shaped ferrous core elements mated to one another, said plurality of shaped ferrous core elements forming at least one winding channel when so mated, said plurality of shaped ferrous core elements also collectively forming at least one wire routing aperture communicating with said at least one winding channel with at least a portion of said plurality of shaped ferrous core elements mated in a face-to-face disposition;

a bonded wire winding having a plurality of turns and disposed at least partly within said channel, said winding further comprising at least two ends which are routed though said at least one wire routing aperture; and a mounting header for said plurality of shaped ferrous core elements, said mounting header comprising:
   a body having an aperture therein, said at least two ends of said winding extending through said at least one aperture, said body of said mounting header supporting said plurality of shaped ferrous core elements;
   a bottom surface disposed proximate said aperture; and
   a plurality of electrically conductive terminals protruding from said bottom surface of said mounting header and adapted for mating to a PCB, said at least two ends of said winding being in electrical communication with ones of said terminals;

wherein said inductive device includes no former or bobbin for said winding, said absence of said former or bobbin reducing the required size and cost of said shaped ferrous core elements as compared to devices having said former or bobbin.

39. A form-less inductive device comprising:
a plurality of shaped ferrous core elements mated to one another, said plurality of shaped ferrous core elements forming at least one winding channel when so mated, said plurality of shaped ferrous core elements also collectively forming at least one wire routing aperture communicating with said at least one channel;
a bonded wire winding having a plurality of turns and disposed at least partly within said channel, said winding further comprising at least two ends which are routed through said at least one wire routing aperture; and
a terminal array comprising a body portion for supporting said plurality of shaped ferrous core elements and further comprising one or more surfaces having a plurality of electrically conductive terminals associated therewith, said plurality of electrically conductive terminals protruding from said one or more surfaces and adapted for electrically and mechanically mating to an external device, said at least two ends of said winding being in electrical communication with ones of said terminals;
wherein said inductive device includes no former or bobbin for said winding, said absence of said former or bobbin reducing the required size and cost of said shaped ferrous core elements as compared to devices having said former or bobbin; and
wherein said bonded wire winding does not protrude below said bottom surface of said terminal array, thereby allowing for said mass termination of said at least two ends to said ones of said terminals.

40. The device of claim 39, wherein said plurality of shaped ferrous core elements each comprise a ferrite "ER" core having a substantially circular center post.

41. The device of claim 39, wherein said bonded wire winding comprises multiple windings bonded into a unitary physical structure.

42. The device of claim 39, wherein said plurality of shaped ferrous core elements are ganged together in an array.

43. The device of claim 42, wherein said plurality of shaped ferrous core elements are ganged together in a multiplicity of formations.

44. The device of claim 43, wherein substantially all of said plurality of turns of said bonded winding are each bonded via an insulative coating to adjacent ones of said winding turns.

45. The device of claim 44, wherein said bonded wire winding comprises multiple windings bonded into a unitary physical structure.

* * * * *